United States Patent
Miyasaka et al.

(10) Patent No.: US 6,521,492 B2
(45) Date of Patent: Feb. 18, 2003

(54) THIN-FILM SEMICONDUCTOR DEVICE FABRICATION METHOD

(75) Inventors: Mitsutoshi Miyasaka, Suwa (JP); Hidetada Tokioka, Tokyo (JP); Tetsuya Ogawa, Tokyo (JP)

(73) Assignees: Seiko Epson Corporation, Tokyo (JP); Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/876,132

(22) Filed: Jun. 8, 2001

(65) Prior Publication Data

US 2002/0058366 A1 May 16, 2002

(30) Foreign Application Priority Data

Jun. 12, 2000 (JP) ........................ 2000-175788
Apr. 6, 2001 (JP) ........................ 2001-108055

(51) Int. Cl.⁷ .................. H01L 21/00; H01L 21/84; H01L 21/44
(52) U.S. Cl. .................. 438/166; 438/150; 438/151; 438/669
(58) Field of Search .................. 438/92, 150, 149, 438/166, 169, 669, 151

(56) References Cited

U.S. PATENT DOCUMENTS

| 4,059,461 A | * | 11/1977 | Fan et al. ............... 438/92 |
| 4,309,225 A | * | 1/1982 | Fan et al. ............... 117/8 |
| 4,319,954 A | * | 3/1982 | White et al. ............ 438/669 |
| 5,766,989 A | * | 6/1998 | Maegawa et al. ........ 438/166 |
| 5,923,968 A | * | 7/1999 | Yamazaki et al. ....... 438/166 |
| 5,937,282 A | * | 8/1999 | Nakajima et al. ....... 438/149 |
| 6,015,720 A | * | 1/2000 | Minegishi et al. ...... 438/166 |
| 6,034,748 A | * | 3/2000 | Furuta ................... 257/66 |
| 6,184,068 B1 | * | 2/2001 | Ohtani et al. ........... 438/151 |
| 6,218,198 B1 | * | 4/2001 | Imao et al. ............. 438/16 |
| 6,232,621 B1 | * | 5/2001 | Yamazaki et al. ........ 257/59 |
| 6,248,606 B1 | * | 6/2001 | Ino et al. ............... 438/150 |
| 6,277,714 B1 | * | 8/2001 | Fonash et al. .......... 438/486 |
| 6,326,248 B1 | * | 12/2001 | Ohtani et al. ........... 438/151 |
| 6,333,520 B1 | * | 12/2001 | Inoue .................... 257/401 |
| 6,335,541 B1 | * | 1/2002 | Ohtani et al. ........... 257/57 |

FOREIGN PATENT DOCUMENTS

JP    A 2000-077333    3/2000

* cited by examiner

Primary Examiner—John F. Niebling
Assistant Examiner—Walter L. Lindsay, Jr.
(74) Attorney, Agent, or Firm—Oliff & Berridge, PLC

(57) ABSTRACT

In the thin-film semiconductor device fabrication method according to the present invention, after forming an amorphous semiconductor film, the film is crystallized in the solid phase state, then a portion of the semiconductor film is molten by irradiating it with a pulsed laser beam having an absorption coefficient in amorphous silicon that is greater than the absorption coefficient in polysilicon. Thereby, polycrystalline thin-film semiconductor devices having superior characteristics can be fabricated.

35 Claims, 20 Drawing Sheets

SOLID PHASE GROWTH POLYCRYSTALLINE FILM

PARTIALLY MELTED STATE

POLYCRYSTALLINE FILM AFTER LIGHT IRRADIATION PROCESS

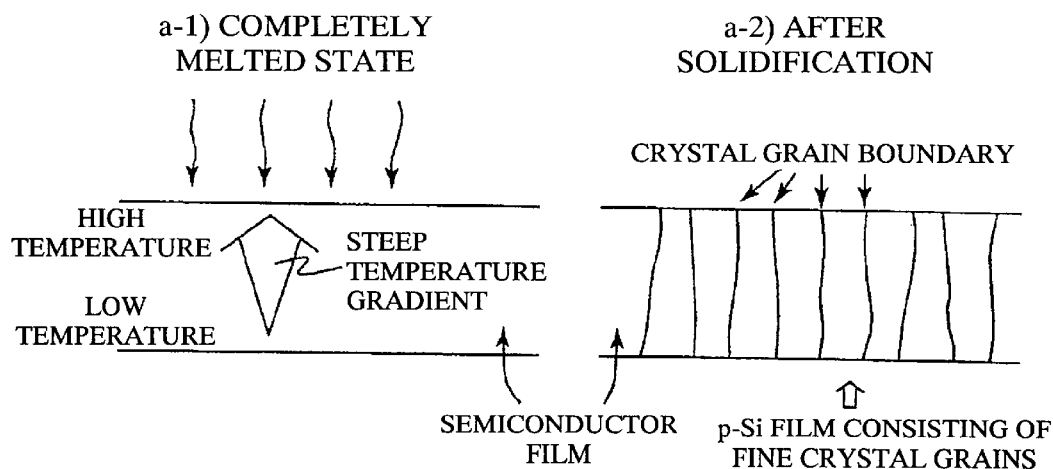
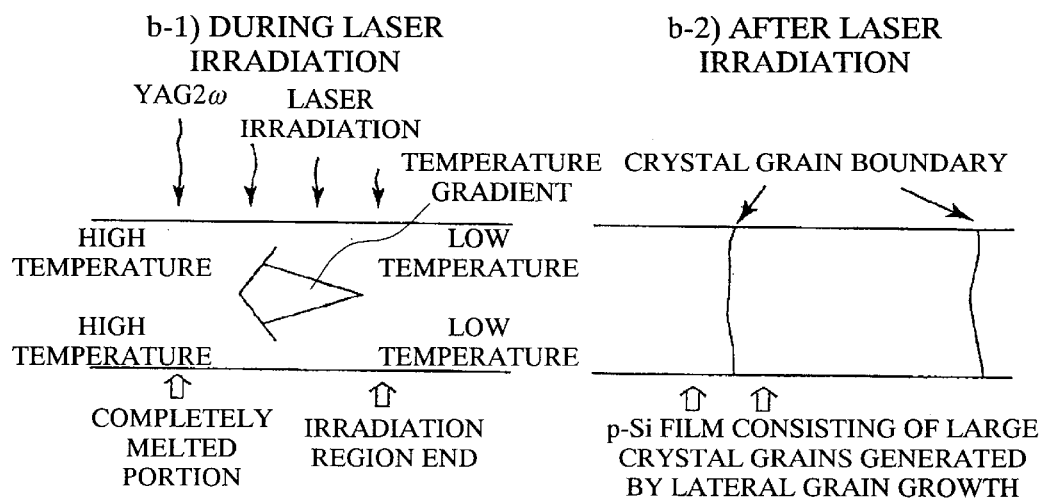

IRRADIATION SHAPE ON SEMICONDUCTOR FILM SURFACE

LASER BEAM INTENSITY DISTRIBUTION ALONG LINE A-A' IN Fig. 7A

IRRADIATION SHAPE ON
SEMICONDUCTOR FILM SURFACE

LASER BEAM INTENSITY DISTRIBUTION
ALONG LINE A-A' IN Fig. 8A

LASER BEAM INTENSITY DISTRIBUTION ALONG
LINE B-B' IN Fig. 8A (TRAPEZOID SHAPE)

LASER BEAM INTENSITY
DISTRIBUTION ALONG LINE B-B' IN
Fig. 8A (GAUSSIAN FUNCTION SHAPE)

LASER BEAM INTENSITY DISTRIBUTION
ALONG LINE B-B' IN Fig. 8A (TRAPEZOID SHAPE)

LASER BEAM INTENSITY DISTRIBUTION
ALONG LINE B-B' IN Fig. 8A
(SHAPE OF TRAPEZOID WITH CONCAVE SIDES)

THIN-FILM SEMICONDUCTOR DEVICE FABRICATION METHOD

BACKGROUND OF THE INVENTION

1. Field of the Invention

The present invention concerns technology for forming, at a relatively low temperature of about 600° C., polycrystalline semiconductor layers having outstanding crystalline properties. This technology is related particularly to a fabrication step capable of markedly improving the performance of thin-film semiconductor devices typified by polysilicon thin-film transistors.

2. Description of Related Art

Conventionally, a fabrication scheme such as that described below has been used when fabricating thin-film semiconductor devices such as polysilicon thin-film transistors (p-Si TFT) at low temperatures of approximately 600° C. or less, where general-purpose glass substrates can be used. First, an amorphous silicon layer serving as a semiconductive layer is deposited on the substrate to a thickness of approximately 50 nm by low-pressure chemical vapor deposition (LPCVD). This amorphous layer is then irradiated with a XeCl excimer laser (wavelength: 308 nm) to form a polysilicon film (p-Si film). Since the absorption coefficient of the XeCl excimer laser in the amorphous silicon and polysilicon is large (0.139 nm$^{-1}$ and 0.149 nm$^{-1}$, respectively), 90% of the laser light impinging on the semiconductor films is absorbed at a depth of 15 nm or less from the surface. In addition, the absorption coefficient of amorphous silicon is approximately 7% smaller than the absorption coefficient of polysilicon. Next, a silicon oxide layer serving as a gate dielectric layer is formed by chemical vapor deposition (CVD) or by physical vapor deposition (PVD). Gate electrodes are then created using a material such as tantalum to form MOSFETs—field effect transistors consisting of a metal (gate), an oxide layer (gate dielectric layer) and a semiconductor (polysilicon layer). Finally, an interlevel dielectric layer is deposited on top of these layers; and, after contact holes are opened, a thin-film of metal interconnects is patterned, completing the thin-film semiconductor device.

However, controlling the energy density of the excimer laser light used in the conventional method of fabricating these thin-film semiconductor devices was difficult, and even slight fluctuations in the energy density caused the semiconductor layer to exhibit significant nonuniformity, even within the same substrate. Moreover, if the irradiated energy density was even slightly higher than the threshold value determined by film thickness and hydrogen content, the semiconductor layer incurred extensive damage, inviting marked deterioration of semiconductor characteristics and product yield. Therefore, the energy density of the laser light had to be set considerably lower than the optimum value to obtain a uniform polycrystalline semiconductor layer. For this reason, obtaining high quality polycrystalline thin films meant that an insufficient energy density could not be avoided. Furthermore, enlarging the grains that comprise the polycrystalline layer was difficult even if the laser was radiated at the optimum energy density; and a large number of defects were left in the layer. Therefore, to consistently fabricate thin-film semiconductor devices such as p-Si TFTs using the conventional fabrication method, the electrical characteristics of the finished thin-film semiconductor devices had to be sacrificed.

SUMMARY OF THE INVENTION

In view of the aforesaid situation, the purpose of the present invention is to provide a method for consistently fabricating extremely high quality thin-film semiconductor devices using a low temperature step of 600° C. or less.

Following an overview of the present invention, the effects of the present invention and its fundamental principles will be described in detail.

The present invention includes a step for fabricating thin-film semiconductor devices having as the active layer a crystalline semiconductor film comprised mainly of silicon (Si) formed on a substrate; a semiconductor layer formation step in which a silicon oxide layer that serves as an underlevel protection layer is formed on the substrate if necessary and an amorphous semiconductor layer comprised mainly of silicon (Si) is deposited on top of the aforesaid underlevel protection layer or on the substrate; a solid phase crystallization step that crystallizes the amorphous semiconductor layer in a solid state and obtains a solid phase crystallization film; and a light irradiating step in which light from a pulsed laser is irradiated on the solid phase crystallization film thus obtained to obtain a crystalline semiconductor film; and is characterized by the fact that the wavelength of the pulsed laser beam used is greater than about 370 nm and less than about 710 nm. The absorption coefficient of said light in polysilicon is greater than the absorption coefficient in amorphous silicon. Moreover, the present invention is also characterized by the fact that the wavelength of the pulsed laser beam is greater than about 450 nm and less than about 650 nm. Accordingly, the absorption coefficient $\mu_{pSi}$ of a pulsed laser beam in polysilicon is from approximately 10$^{-2}$ nm$^{-1}$ to 10$^{-3}$ nm$^{-1}$. In this case, if the film thickness of the semiconductor layer is taken to be d, it is desirable for the film thickness d(nm) and the absorption coefficient of the pulsed laser beam in polysilicon $\mu_{pSi}$ (nm$^{-1}$) to satisfy the following relationship:

$$0.105 \cdot \mu_{pSi}^{-1} < d < 0.693 \cdot \mu_{pSi}^{-1}.$$

Ideally, the following relationship is satisfied:

$$0.405 \cdot \mu_{pSi}^{-1} < d < 0.693 \cdot \mu_{pSi}^{-1}.$$

In order for the present invention to be applicable to devices such as liquid crystal displays, it is desirable for the substrate to be transparent to visible light. Further, regardless of the application, it is also desirable for the substrate to be essentially transparent to the pulsed laser beam. "Essentially transparent" means that the absorption coefficient of the pulsed laser beam in the substrate is approximately one tenth the absorption coefficient in polycrystalline silicon or lower. Specifically, the absorption coefficient of the substrate $\mu_{Sub}$ should be approximately 10$^{-4}$ nm$^{-1}$ or lower. Normally, formation of the amorphous semiconductor layer mentioned above would include a deposition step by chemical vapor deposition (CVD). Within the chemical vapor deposition process category, low pressure chemical vapor deposition (LPCVD) and plasma-enhanced chemical vapor deposition are particularly applicable for deposition of amorphous semiconductor thin films; and it can be said further that amorphous semiconductor layer deposition in a high-vacuum low pressure chemical vapor deposition chamber or in a high-vacuum plasma-enhanced chemical vapor deposition chamber is ideal. A high-vacuum low pressure chemical vapor deposition chamber is one in which the background pressure immediately prior to semiconductor layer deposition is typically 5×10$^{-7}$ Torr or less, and that can achieve an atomic oxygen concentration within the amorphous semiconductor layer of approximately 2×10$^{16}$ cm$^{-3}$ or less even when the amorphous semiconductor layer is formed at a slow deposition rate of approximately 1.5 nm/min or less.

Similarly, "high-vacuum plasma-enhanced chemical vapor deposition chamber" refers to a deposition system in which the background pressure immediately before semiconductor layer deposition is typically $1\times10^{-6}$ Torr or less, and that can achieve an atomic oxygen concentration within the deposited amorphous semiconductor layer of approximately $2\times10^{16}$ cm$^{-3}$ or less even when the deposition rate of the amorphous semiconductor layer is approximately 1 nm/sec or less. When a YAG 2ω laser beam impinges on a semiconductor layer comprised mainly of silicon, it is preferable for the thickness of the semiconductor layer to be approximately 25 nm or more and approximately 165 nm or less, and, ideally, approximately 25 nm or more and approximately 95 nm or less.

The solid phase crystallization step is performed by inserting a substrate on which an amorphous semiconductor layer has been formed into an annealing furnace and maintaining a state of near thermal equilibrium, or is performed with a rapid thermal annealing system. When performed in an annealing furnace, the solid phase crystallization progresses at an annealing temperature of between approximately 400° C. and 700° C.

The ideal pulsed laser wavelength in the light irradiation step of the present invention is approximately 532 nm. For the pulsed laser beam, the harmonic of a solid-state laser having Q-switch oscillation (a Q-switched solid state laser) is preferred. Desirable as the lasing medium in a Q-switched solid state laser are crystals doped with Nd ions, crystals doped with Yb ions, glass doped with Nd ions, glass doped with Yb ions, and so forth. Specifically, therefore, it is best to use as a pulsed laser beam the second harmonic (wavelength: 532 nm) of a Q-switched Nd:YAG laser (abbreviated as YAG 2ω), the second harmonic (wavelength: 532 nm) of a Q-switched Nd:YVO4 laser, the second harmonic (wavelength: 524 nm) of a Q-switched Nd:YLF laser, the second harmonic (wavelength: 515 nm) of a Q-switched Yb:YAG laser, and so forth.

The shape of the irradiated region on the semiconductor layer during the irradiation of the solid phase crystallization layer with a pulsed laser beam in the light irradiation step is either nearly rectangular or a line profile, having width W ($\mu$m) and length L (mm). Within the irradiated region, the pulsed laser's irradiation energy density has a roughly trapezoidal distribution along the length of the region. On the other hand, along the width of the region, it is preferable to have an irradiation energy density having either an approximately trapezoidal or approximately Gaussian distribution. It is desirable for the ratio (L/W) of the irradiation region length, L, to the width, W, to be greater than or equal to 100 and ideally greater than or equal to 1000.

It is preferable for the maximum gradient of the irradiation energy density along the width of the pulsed laser beam's profile to have a value of 3 mJ·cm$^{-2}$·$\mu$m$^{-1}$ or higher. If the location at which the maximum value of the irradiated energy density gradient in the widthwise direction of this pulsed laser beam and the location at which the maximum value of the irradiated energy density in the widthwise direction of the pulsed laser beam are nearly coincident, it is even better for fabricating high quality thin-film semiconductor devices.

The beam width during irradiation is preferably approximately 1 $\mu$m or more and approximately 6 $\mu$m or less. The region on the solid phase crystallization layer irradiated by the pulsed laser beam is gradually shifted in the widthwise direction after each pulse until the entire surface of the substrate is completely irradiated. The widthwise direction of the irradiated area during pulsed laser beam irradiation is nearly parallel to the direction of electric current flow within the active layer of a finished, operating thin-film semiconductor device. During laser irradiation, the light irradiation step is performed such that any given point on the semiconductor layer is subjected to pulsed laser beam irradiation between 10 times and 80 times. The Irradiated energy density of the pulsed laser beam on the solid phase crystallization layer is of an intensity that melts at least the surface of the solid phase crystallization layer, and preferable still, is of an intensity that melts approximately two-thirds or more of the thickness of the solid phase crystallization layer. Conversely, the upper limit of irradiated energy density is below the intensity at which a portion of the solid phase crystallization layer is ablated, and ideally, is below the intensity at which the solid phase crystallization layer is melted over the entire thickness. Specifically, when light having a wavelength of approximately 532 nm is used as the pulsed laser beam, the irradiated energy density of the pulsed laser beam on the solid phase crystallization layer is approximately 100 mJ·cm$^{-2}$ or less and approximately 1500 mJ·cm$^{-2}$ or more, but preferably is between approximately 600 mJ·cm$^{-2}$ or more and approximately 1500 mJ·cm$^{-2}$ or less, or approximately 100 mJ·cm$^{-2}$ or more and approximately 850 mJ·cm$^{-2}$ or less, and ideally is between approximately 600 mJ·cm$^{-2}$ or more and approximately 850 mJ·cm$^{-2}$ or less.

BRIEF DESCRIPTION OF THE DRAWING

FIGS. 4A and 4B are figures that explain the principle of the present invention.

DETAILED DESCRIPTION OF THE INVENTION

Figure 1A:
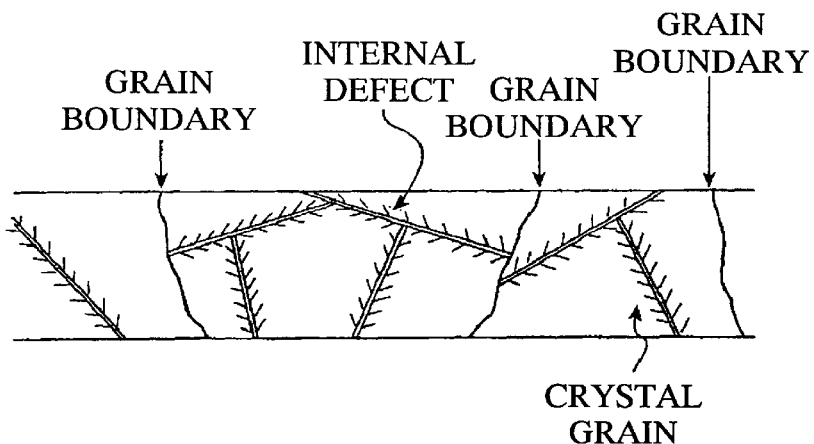
FIGS. 1A through 1C are figures that explain the principle of the present invention.

The present invention concerns a method of fabricating thin-film semiconductor devices employing as the active layer a crystalline semiconductor layer formed on all manner of transparent substrates, including low heat resistance glass substrates having a glass strain point of between 550° C. and 650° C., or high heat resistance glass substrates such as quartz substrates, includes a semiconductor layer formation step that, where necessary, forms a silicon oxide film serving as a underlevel protection layer, and deposits an amorphous semiconductor layer comprised mainly of silicon (Si) on said underlevel protection layer or on the substrate; a solid phase crystallization step that crystallizes said amorphous semiconductor layer in a solid phase state to obtain a solid phase crystallization layer; a light irradiation step that irradiates the thus formed solid phase crystallization layer with a pulsed laser beam to obtain a crystalline semiconductor layer; and is characterized by the pulsed laser beam used in the light irradiation step having a wavelength of approximately 370 nm or more and approximately 710 nm or less. The said light has an absorption coefficient in amorphous silicon greater than the absorption coefficient in polysilicon. The best pulsed laser beam is the second harmonic of a Q-switched Nd:YAG laser.

When the present invention is applied to liquid crystal display devices, a substrate that is transparent to visible light is preferred, and if applied to something other than a liquid crystal display device, the substrate should at least be nearly transparent with respect to the pulsed laser beam. Specifically it is a condition that the absorption coefficient for the pulsed laser beam in the substrate be equal to or less than approximately one-tenth of the absorption coefficient with respect to polysilicon. This is because, since the present invention employs a technology for strictly adjusting the transmittance of a pulsed laser in the semiconductor layer, if the absorption coefficient of the laser light on the substrate is not sufficiently small with respect to the absorption coefficient on the semiconductor layer, laser light induced damage will occur on the substrate. As described later, in order to obtain high quality crystalline semiconductor films, the intensity and wavelength of the pulsed laser, the thickness of the semiconductor film, and other factors have to be optimized, and to achieve that the substrate must be nearly transparent to the pulsed laser beam. In fact, if the absorption coefficient of the pulsed laser beam on the substrate is approximately one-tenth or less the absorption coefficient in the semiconductor film, the thickness of the layer that absorbs laser light within the substrate will be approximately 10 times or more thickness of the absorption layer in the semiconductor film. Because the volume in which the light is absorbed by the substrate increases, the heat capacity also increases commensurately, enabling the temperature rise of the substrate to be relatively controlled. In other words, in order to create high quality thin-film semiconductor devices without rendering damage to the substrate and thin-film semiconductor devices, it is essential that the substrate meets the aforesaid optical property conditions.

In the semiconductor film formation step, an amorphous semiconductor film comprised mainly of silicon (Si) is deposited either on the substrate or on top of an underlevel protection layer formed on the substrate. A semiconducting material such as a silicon film (Si) or a silicon germanium film ($Si_xGe_{1-x}$:0<x<1) is used as the semiconductor layer; and silicon is the major atomic constituent (silicon atom fraction of 80% or higher). For the substrates, it is conventional to use transparent non-alkali glass used for liquid crystal displays or insulating substrates such as transparent crystalline glass, quartz glass or ceramic, although any type can be used as long as the heat resistance of the substrate (the strain point temperature in the case of glass substrates) is equal to or greater than approximately 650° C. If a material other than high-purity quartz glass is used, it is desirable to deposit on the surface of the substrate approximately 100 nm to approximately 10 $\mu$m of silicon oxide to act as an underlevel protection layer with respect to the semiconductor layer.

The silicon oxide underlevel protection layer does not act solely to electrically isolate the semiconductor layer and the substrate or to prevent the diffusion of impurities from the substrate into the semiconductor layer, but also creates a good interface between the underlevel oxide layer and the crystalline semiconductor layer. In the present invention, the semiconductor layer in the thin film semiconductor devices has a thickness of between roughly 10 nm and 200 nm and corresponds to the case in which the energy band bends across the entire thickness of the semiconductor layer (corresponding to a full depletion SOI model). Under these conditions, undeniable contributions to electrical conduction can come from both the gate insulator-semiconductor layer interface and the underlevel protection layer and semiconductor layer interface. Because silicon oxide is the material which can best decrease interface trap states when it forms an interface with the semiconductor layer, it is appropriate for the underlevel protection layer. The semiconductor layer is formed on top of this underlevel protection layer.

Therefore, the use of a silicon oxide layer which can form an interface with the semiconductor layer which has on the order of $10^{12}$ cm$^{-2}$ or fewer interface states is desirable as the underlevel protection layer in the present invention. Further, with the present invention, because there is a strong tendency for the bottom portion of the semiconductor layer to also be heated to a high temperature in comparison to the technology of the prior art, the diffusion of impurities from the substrate can occur easily. Therefore, to avoid this and produce high quality thin film semiconductor devices using high purity semiconductor films in the present invention, it is essential to use highly dense silicon oxide films as the underlevel protection layer. Silicon oxide films of this type have an etching rate of 1.5 nm/sec or less in a 1.6±0.2% aqueous solution of hydrofluoric acid (HF) held at 25±5° C. Normally, the underlevel protection layer is formed by a vapor deposition method such as plasma-enhanced chemical vapor deposition (PECVD), low pressure chemical vapor deposition (LPCVD), or sputtering. Among these, as a means which is particularly applicable in the present invention for depositing the underlevel protection layer, it is desirable to use a type of PECVD such as electron cyclotron resonance PECVD (ECR-PECVD), helicon PECVD, or remote PECVD. Further, in order to obtain a silicon oxide film appropriate for the present invention through the use of conventional PECVD at either the industrial frequency (13.56 MHz) or an integer multiple of this frequency, TEOS (Si—(O—CH$_2$CH$_3$)$_4$) and oxygen (O$_2$) should be used as source materials with the oxygen flow rate set to be at least five times the TEOS flow rate to deposit the silicon oxide films. Alternatively, the silicon oxide can be deposited using a mixture of monosilane (SiH$_4$) and nitrous oxide (N$_2$O) as source materials and a noble gas such as either helium (He) or argon (Ar) as a dilution gas; and the noble gas flow rate should be greater than about 90% of the total gas flow rate (in other words, the flow rate of the source gases should be less than about 10% of the total gas flow rate). The substrate temperature should be 280° C. or higher during this procedure. When high purity quartz is used for the substrate, it may be used as both the underlevel protection layer and the substrate; but formation of the underlevel protection layer using the method described above is preferable in order to minimize variation in the semiconductor film quality by having a fixed surface condition.

A semiconductor layer that is in the amorphous state is deposited on top of the underlevel protection layer. Although various types of vapor phase deposition methods such as plasma-enhanced chemical vapor deposition (PECVD), low pressure chemical vapor deposition (LPCVD), atmospheric pressure chemical vapor deposition (APCVD), or sputtering may be used to deposit the semiconductor film, among these, low pressure chemical vapor deposition (LPCVD) and plasma-enhanced chemical vapor deposition (PECVD) are particularly appropriate for allowing easy deposition of high purity semiconductor films.

It is desirable for the deposition of the amorphous semiconductor film, which is mainly comprised of silicon as exemplified by an amorphous silicon layer, to be done using a higher silane ($Si_nH_{2n+2}$: n=2, 3, 4) as one of the source gases. From the consideration of factors such as cost and safety, disilane ($Si_2H_6$) is the most appropriate higher silane. Using disilane with low pressure chemical vapor deposition, it is possible to deposit high purity amorphous silicon films at a relatively high rate of 0.5 nm/min or higher at the low temperature of 425° C. or less. In order to obtain high quality amorphous semiconductor films appropriate for the present invention, the control of the deposition temperature and the deposition rate is important. Determination of the disilane flow rate and pressure during deposition is necessary to achieve deposition at a temperature of 430° C. or less and a deposition rate of 0.6 nm/min or higher.

Low pressure chemical vapor deposition occurs in a high-vacuum low-pressure chemical vapor deposition reactor. This is because increasing the purity of the semiconductor film minimizes the generation of crystal nuclei that result from impurities and allows the present invention to ultimately obtain high purity crystalline semiconductor films that have large grain size. In particular, the present invention not only obtains a polycrystalline solid phase crystallization semiconductor layer having large grains in the solid phase crystallization step and minimizes crystal nuclei density caused by impurities, it may also produce a completely melted state throughout the thickness of the semiconductor layer at the laser irradiation step. Therefore, if the generation of crystal nuclei caused by impurities is minimized, lateral crystal growth in completely melted regions can be promoted by using a laser beam suited to melt crystallization. With the technology of the prior art, completely melted portions were composed of very fine grains, because the level of impurities was uncontrolled and the laser beam was non-optimal. The present invention, however, can obtain in the aforesaid manner polycrystalline semiconductor thin-films composed of large grains in the completely melted portions.

A high-vacuum low pressure chemical vapor deposition chamber is one in which the background pressure immediately prior to semiconductor layer deposition is typically $5 \times 10^{-7}$ Torr or less, and that can achieve an atomic oxygen concentration within the amorphous semiconductor layer of approximately $2 \times 10^{16}$ cm$^{-1}$ or less even when the amorphous semiconductor layer is formed at a slow deposition rate of approximately 1.5 nm/min or less. It is desirable that this type of high-vacuum low pressure chemical vapor deposition chamber not only have superior deposition chamber air-tightness but also have high exhaust performance, with an exhaust rate in the deposition chamber of approximately 120 sccm/mTorr or higher (an exhaust rate at which the equilibrium pressure obtained with an inert gas is flowing at 120 sccm into the chamber is 1 mTorr). This is because systems having the aforesaid high exhaust performance can sufficiently decrease substrate outgassing and so forth in a relatively short period of time of about one hour, maintain high throughput, and, further, enable deposition of high purity semiconductor thin films.

Low pressure chemical vapor deposition is difficult to use when large-sized substrates having an area of 2000 cm$^2$ or greater are used. When amorphous semiconductor films are deposited under these conditions, a high-vacuum plasma-enhanced chemical vapor deposition system is used. This type of deposition system typically has a background pressure immediately prior to semiconductor film deposition of $1 \times 10^{-6}$ Torr or lower and can achieve an atomic oxygen concentration within the semiconductor of $2 \times 10^{16}$ cm$^{-3}$ or less even for amorphous semiconductor films that have been deposited at a low deposition rate of 1 nm/sec or less. The most suitable type of high vacuum plasma-enhanced chemical vapor deposition system is a plasma box type of PECVD reactor in which the plasma processing deposition chamber is located within another larger vacuum chamber. A plasma box type of PECVD reactor has the effect of having higher vacuum in the deposition chamber because the deposition chamber has a double vacuum construction; and, at the same time, is a hot wall type of plasma enhanced-chemical vapor deposition system in which the entire walls of the deposition chamber are heated and the wall temperature and substrate temperature become essentially identical at the time of deposition. This is recognized as having the effect of minimizing the amount of outgassed impurities from the deposition chamber wall and increasing the vacuum.

Since thus improving the background pressure present during amorphous semiconductor film deposition also decreases the amount of outgassing from the chamber walls, the purity of the deposited semiconductor layer is increased; and the same effects as that described in the previous discussion of low pressure chemical vapor deposition are also produced in thin-film semiconductor devices. Although the background pressure of a high-vacuum plasma-enhanced chemical vapor deposition system is inferior to the background pressure of a high-vacuum low pressure chemical vapor deposition system, the impurity density within the semiconductor layer can be markedly reduced because the semiconductor layer deposition rate can be accelerated to 0.1 nm/sec or higher. Monosilane ($SiH_4$) or disilane ($Si_2H_6$) are used as source gases in semiconductor layer formation, and the substrate temperature during deposition should be between approximately 100° C. and approximately 450° C. Because the level of hydrogen contained in the amorphous silicon semiconductor layer decreases as substrate temperature rises, the subsequent solid phase crystallization step progresses stably. Ideally, the substrate temperature during amorphous silicon layer deposition is between approximately 250° C. and approximately 450° C. If the temperature is greater than about 250° C., the level of hydrogen contained in the amorphous silicon film can be decreased to approximately 8 atm % or less, allowing the solid phase crystallization step to proceed stably. If the temperature is lower than approximately 450° C., the grains that comprise the amorphous silicon layer will be large, as will the grains that comprise the polycrystalline layer obtained when said amorphous crystalline layer is crystallized. More ideal, the amorphous crystal grains increase at or below approximately 450° C. To prevent removal of the semiconductor layer resulting from hydrogen outgassing during the solid phase crystallization step, it is essential that the level of hydrogen contained in the semiconductor layer be preferably about 5 atm % or less, and, moreover, the substrate temperature during film formation approximately 280° C. or greater, and a deposition rate of approximately 0.5 nm/sec or less. In order to minimize semiconductor layer contamination with impurities, a deposition rate of 0.1 nm/sec or more is required, meaning, therefore, that the amorphous silicon layer deposition conditions best for the present invention are a substrate temperature during deposition of approximately 280° C. or higher and approximately 400° C. or lower, and a deposition rate of approximately 0.1 nm/sec or more and approximately 0.5 nm/sec or less.

After an amorphous crystalline semiconductor layer is thus obtained, the amorphous crystalline semiconductor layer is crystallized in the solid phase state, forming a solid phase crystallization polycrystalline semiconductor layer (solid phase crystallization step). Crystallization of the amorphous crystalline layer is performed either by inserting the substrate on which the amorphous crystalline semiconductor layer has been formed into an annealing furnace and conducting crystallization in a state of near thermal equilibrium, or is performed using a rapid thermal annealing system. If performed in a thermal annealing chamber, solid phase crystallization proceeds at a thermal annealing temperature of approximately 400° C. or more and approximately 700° C. or less. In terms of throughput, an annealing temperature of approximately 500° C. or more is preferred; while from a perspective of generating large grains, a temperature of approximately 650° C. or less is preferred. Solid phase crystallization in such a temperature range exhibits an extremely strong correlation between the size of the domains that comprise the amorphous layer and the size of the grains that comprise the polycrystalline layer. In other words, if an amorphous layer comprised of large amorphous domains is crystallized in the solid phase by thermal annealing in the aforesaid temperature range, a solid phase crystallized polycrystalline layer consisting of large grains will be obtained. Because the generation of crystal nuclei decreases as thermal annealing temperature decreases during the crystallization step, a polycrystalline layer comprised of larger grains can be obtained; but the length of time required to complete crystallization is correspondingly longer. Thermal annealing temperature is set at a prescribed temperature that is as low as possible between approximately 500° C. and approximately 650° C., and, ideally, between approximately 550° C. and approximately 600° C. It is preferred that such solid phase crystallization take place in an oxidizing environment containing from approximately 10 ppm to approximately 10% oxygen. By doing so, a thin oxide film is formed on the semiconductor layer surface during solid phase growth. The formation of the oxide film produces lattice mismatch between the semiconductor atoms and oxide film atoms, placing large stress on the semiconductor layer during crystal growth. The large stress promotes the movement of semiconductor atoms, resulting in the reduction of stacking faults and twins inherent in solid phase crystallized polycrystalline layers. In other words, this leads to the production of thin-film semiconductor devices having good switching characteristics, with lower threshold and subthreshold voltages of the thin-film semiconductor devices ultimately obtained.

Figure 1B:
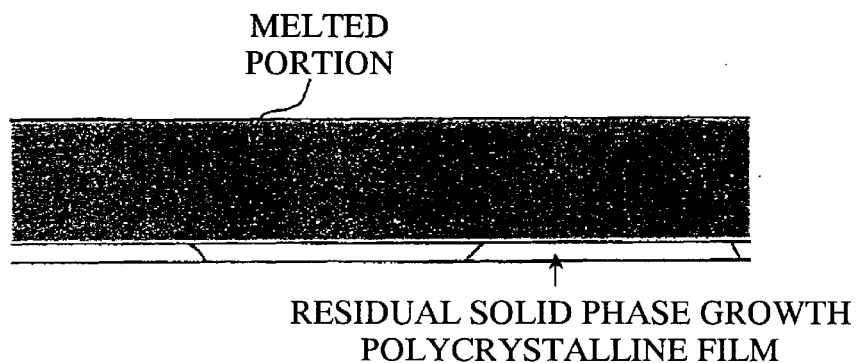
Figure 1C:
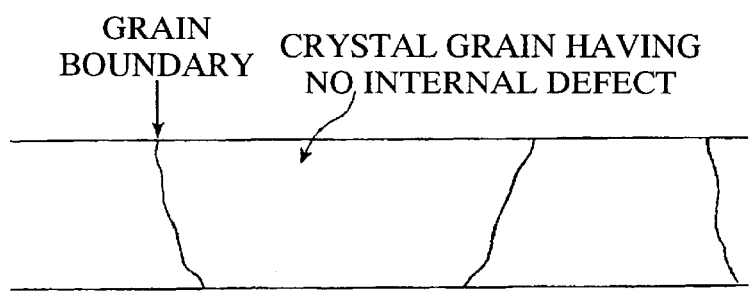

After a solid phase crystallized polycrystalline semiconductor layer is thus obtained, this solid phase crystallization layer is irradiated with a pulsed laser beam at an irradiation step, in which at least the surface of the semiconductor layer is melted and the polycrystalline semiconductor layer is recrystallized. Depending on the control of the film formation conditions, the solid phase crystallized polycrystalline layer obtained at the solid phase crystallization step is comprised of extremely large grains having a grain diameter between approximately 2 $\mu$m and 5 $\mu$m. Nevertheless, these solid phase growth layers contain a huge number (approximately $1 \times 10^{18}$ cm$^{-3}$) of internal defects in the form of stacking faults and twins inside the grains (FIG. 1A). With the beam irradiation step of the present invention, however, large grain size is maintained while these internal defects are reduced in number. In the beam irradiation step, the solid phase crystallized polycrystalline layer is irradiated with pulsed laser light such that a portion of the semiconductor layer (primarily the upper portion along the depth of the semiconductor layer) is melted (FIG. 1B). The semiconductor layer is not melted over the entire film thickness; and a portion in the vicinity of the interface with the underlevel protection layer is left as the original solid phase crystallized polycrystalline layer. This residual solid phase crystallization layer serves as a crystal source during cooling solidification, allowing the grain diameter of the original solid phase crystallized polycrystalline layer to be maintained as recrystallization progresses. Thus the diameter of the grains after recrystallization is also larger, being the same size as those in the original layer, approximately 2 $\mu$m to approximately 5 $\mu$m. As for internal defects in the solid phase crystallization layer produced using the present invention, components running parallel to the substrate are dominant; and, moreover, because the temperature of the residual solid phase crystallized polycrystalline layer at the time of melt crystallization rises to near 1414° C., the melting temperature of silicon, crystal defects in the residual solid phase crystallized polycrystalline layer are greatly reduced during the melt crystallization step. In addition, repeating melt crystallization approximately 10 to 80 times markedly reduces the number of defects in the residual solid phase growth layer, with each repetition of melt crystallization contributing to further reductions. Since a residual solid phase crystallized polycrystalline layer having an extremely low number of crystal defects is thus formed and the cooling solidification step progresses with those crystals as a growth source, the majority of internal grain defects can be eliminated by passing through the partially melted state shown in FIG. 1B, yielding a polycrystalline semiconductor layer having large grain diameter and an extremely small number of internal defects (FIG. 1C).

A continuous wave laser can be used as the irradiating laser light source, but using a pulsed laser beam is preferable. Irradiating the semiconductor layer with a continuous wave laser causes the semiconductor layer to be in a melted state over a long period of time of several milliseconds or more. Therefore, the film becomes more susceptible to contamination by vapor phase impurities and becomes more susceptible to surface roughness. On the other hand, a melt time of several hundred microseconds or less can be obtained by a pulsed laser beam which is moved a suitable distance after each irradiation, producing a polycrystalline semiconductor thin film having high purity and a smooth surface.

Figure 2:
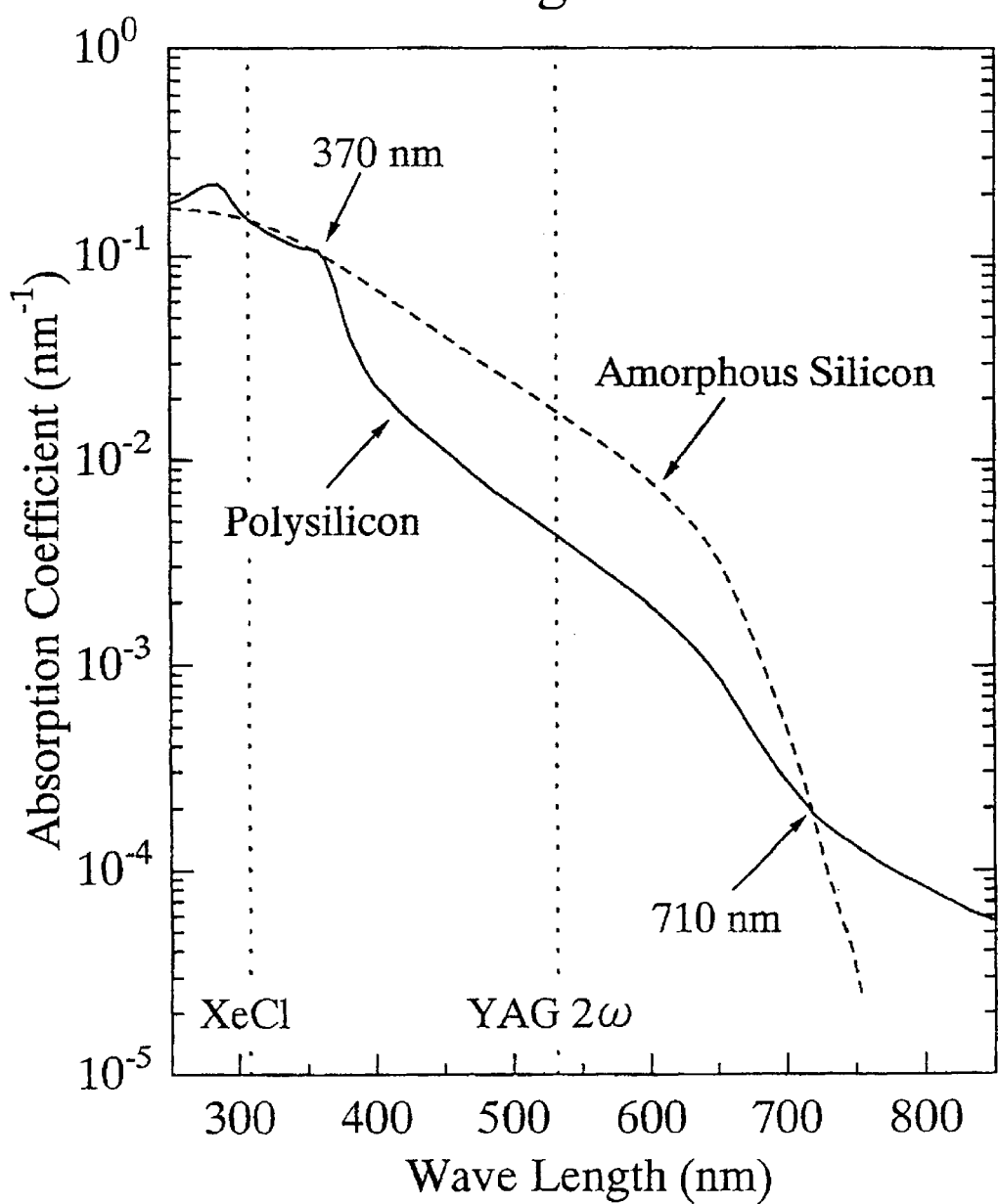
FIG. 2 is a figure that explains the relationship between beam wavelength and absorption coefficient in a semiconductor.

When the semiconductor layer is irradiated by the laser beam, a pulsed laser beam having a wavelength of 370 nm or greater and 710 nm or less is used. The absorption coefficients of these beams in amorphous silicon and in polycrystalline silicon are shown in FIG. 2. The horizontal axis in FIG. 2 is the wavelength of the beam, and the vertical axis is the absorption coefficient. The dashed line represents amorphous silicon while the solid line represents polysilicon. As shown in FIG. 2, in the wavelength range between 370 nm and 710 nm, the absorption coefficient is larger in amorphous silicon than in polysilicon. In other words, the solid phase crystallized polycrystalline semiconductor layer is irradiated with a pulsed laser beam in which the absorption coefficient in amorphous silicon exceeds the absorption coefficient in polycrystalline silicon. For example, the absorption coefficient of amorphous silicon $\mu_{aSi}$ and the absorption coefficient of polycrystalline silicon $\mu_{pSi}$ are $\mu_{aSi}(\text{YAG } 2\omega) = 0.01732$ nm$^{-1}$ $\mu_{pSi}(\text{YAG } 2\omega) = 0.00426$ nm$^{-1}$ respectively, at a wavelength of approximately 532 nm, which corresponds to the second harmonic of a Nd-doped YAG laser (abbreviated as YAG 2ω). The absorption coefficient in amorphous silicon is more than four times the absorption coefficient in polycrystalline silicon. The solid phase crystallized polycrystalline film is composed microscopically of crystalline and non-crystalline components. The crystalline components have a relatively small number of defects such as stacking faults within the grains and can be said to possess good crystal quality. On the other hand, the non-crystalline components can be seen to contain regions with noticeable structural disorder such as in the grain boundaries and within grains and can be said to be close to so-called amorphous in nature. In melt crystallization in which crystallization occurs through laser beam irradiation, the unmelted regions become grain growth nuclei during the cooling solidification step. If crystalline components with a high degree of structural order act as grain growth nuclei, grains which grow from these regions also exhibit a high degree of structural order and result in a high quality crystalline film. In contrast, if regions with structural disorder act as grain growth nuclei, stacking faults and other defects originate from these locations during the cooling solidification step, ultimately producing films that are of low quality and contain defects.

Consequently, in order to produce high quality crystalline films, the crystalline components within the solid phase crystallized polycrystalline films should act as grain growth nuclei without melting; and the amorphous regions should be melted preferentially. In the present invention, the absorption coefficient of the laser beam in amorphous silicon is larger than the absorption coefficient of the laser beam in polycrystalline silicon; hence, the amorphous components are heated preferentially with respect to the crystalline components. As a result, because grain boundaries, defects, and other amorphous components melt easily while the high quality crystalline components, which act as though essentially single crystalline in nature, remain intact without melting and act as grain growth nuclei, excellent grains having an extremely low number of defects are formed in the cooling solidification step. In this way, defects and dangling bonds are significantly reduced and high symmetry grain boundaries having a high degree of structural order predominate. From the perspective of the electrical characteristics of the semiconductor films, the phenomenon described above leads to a significant decrease in the density of trap states that appear near the middle of the band gap in the energy band diagram.

Additionally, if semiconductor films such as those described above are used for the active layer (source and drain regions as well as the channel region) in thin film semiconductor devices, transistors with low off-currents, steep subthreshold characteristics (small subthreshold swing), and low threshold voltages result. One reason that it was difficult to produce such excellent thin film semiconductor devices using the technology of the prior art was that a laser having a wavelength appropriate for melt crystallization of the solid phase crystallized polycrystalline layer was not used, and both crystalline and amorphous components were melted. The principle of the present invention described above is most effective when the ratio of the absorption coefficient in polycrystalline silicon to the absorption coefficient in amorphous silicon ($\mu_{pSi}/\mu_{aSi}$) is large. From FIG. 2, it can be seen that this ratio is large in the wavelength range between approximately 450 nm and 650 nm. Therefore, it can be said that the most desirable wavelength for the pulsed laser beam used for irradiation in the laser irradiation step in the present invention is between approximately 450 nm and 650 nm. The absorption coefficient in polycrystalline silicon $\mu_{pSi}$ for light having a wavelength of 450 nm is $1.127 \times 10^{-2}$ nm$^{-1}$, and the absorption coefficient in polycrystalline silicon for light having a wavelength of 650 nm is $8.9 \times 10^{-4}$ nm$^{-1}$. Therefore, for the laser irradiation step using pulsed laser irradiation with a wavelength between approximately 450 nm and 650 nm, a pulsed laser beam having an absorption coefficient in polycrystalline silicon $\mu_{pSi}$ of between roughly $10^{-3}$ nm$^{-1}$ and $10^{-2}$ nm$^{-1}$ is used.

Because the pulse stability of the laser beam is the most important factor in obtaining final high quality crystalline semiconductor films, a pulsed laser beam produced by a Q-switched solid-state light emitting element is preferred. (This is abbreviated as solid-state laser in this disclosure.) With the excimer gas laser of the prior art, the variation in pulse intensity was about 5% resulting from such things as nonuniformity of the xenon (Xe) and chlorine (Cl) gases in the laser resonator cavity, deterioration of the gases themselves or halogen erosion of the resonator cavity. Additionally, variation in the lasing angle was also on the order of 5%. Because the variation in the lasing angle caused variation in the area of the irradiation region, the result was that the energy density (energy per unit area) on the surface of the semiconductor film varied by a total of as much as 10% or more and became one factor that impeded the fabrication of superior thin film semiconductor devices.

Further, the long term stability of the laser pulses was lacking and led to within-lot variation of the thin film semiconductor devices. In contrast, because these types of problems do not exist with solid-state lasers, the laser oscillation is extremely stable, allowing variation in the energy density on the semiconductor film (the ratio of the standard deviation to the mean) to be less than about 5%. In order to more effectively apply the present invention practically, the use of a solid-state laser which can maintain the variation in laser energy density of the surface of the semiconductor film at less than 5% as described above is required. Additionally, the use of a solid-state laser leads to such effects as the minimization of within-lot variation during the production of thin film semiconductor devices and improvements in thin film semiconductor device production throughput, as well as cost decreases by alleviating the burdensome task of frequently exchanging gas supplies which existed previously. A solution that can simultaneously meet the previously described demands for wavelength and absorption coefficient as well as the demand for solid-state is the second harmonic (YAG 2ω), wavelength of 532 nm) of the neodymium-doped yttria-alumina-garnet (Nd:YAG) laser in which neodymium (Nd) has been added to the compound oxide of yttrium oxide ($Y_2O_3$) and aluminum oxide ($Al_2O_3$). Consequently, in the laser irradiation step of the present invention, the most appropriate irradiation of the semiconductor film is by the YAG 2ω which keeps the energy density variation on the surface of the semiconductor film to less than about 5%. Desirable as a laser medium in a Q-switched solid state laser are crystals doped with Nd ions, crystals doped with Yb ions, glass doped with Nd ions, glass doped with Yb ions, and so forth. Specifically, therefore, other than a YAG 2ω, it is best to use as a pulsed laser beam, the second harmonic (wavelength of 532 nm) of a Q-switched Nd:YVO4 laser beam, the second harmonic (wavelength of 524 nm) of a Q-switched Nd:YLF laser beam, the second harmonic (wavelength of 515 nm) of a Q-switched Yb:YAG laser light, and so forth.

Light is absorbed within the semiconductor film, and the intensity of the incident light is exponentially attenuated.

Now if the intensity of the incident light is $I_{(0)}$, x (nm) is the distance from the surface of the polycrystalline semiconductor film comprised mainly of silicon to a point within the film and the intensity of the light at this point x is $I_{(x)}$, using the absorption coefficient $\mu_{pSi}$, the following relationship applies, $$I_{(x)}/I_{(0)} = \exp(-\mu_{pSi} \cdot x) \quad \text{(Equation 1)}.$$

Figure 3:
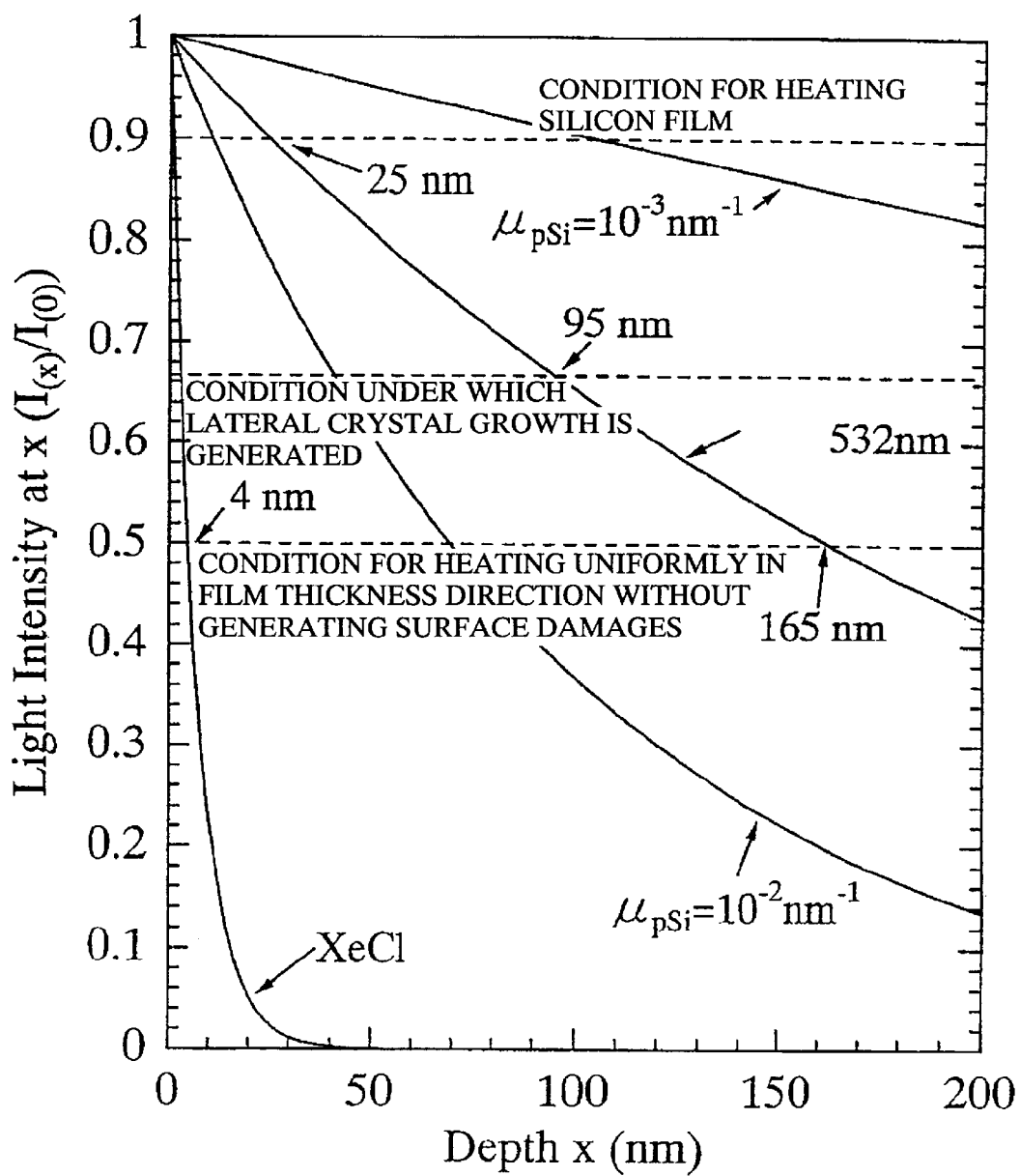
FIG. 3 is a figure that explains the relationship between semiconductor film thickness and beam intensity in the film.

The relationship in Equation 1 is shown in FIG. 3 for the case of $\mu_{pSi}$ equal to $10^{-3}$ nm$^{-1}$, the case of $\mu_{pSi}$ equal to $10^{-2}$ nm$^{-1}$, the second harmonic of the Nd:YAG laser most appropriate as the pulsed laser beam source for the present invention (YAG 2ω), and the XeCl excimer laser of the technology of the prior art. Since it is necessary for at least 10% of the incident light to be absorbed by the semiconductor film in order to have efficient heating of the silicon film, a horizontal dashed line has been drawn in FIG. 3 at the 0.9 location, which corresponds to this condition. Further, the light intensity means the amount of heat that can be provided to the silicon and, therefore, FIG. 3 shows the temperature profile within the silicon film during irradiation by the laser beam. According to the research of the inventor and others, the surface of the semiconductor film was heavily damaged by the excimer laser of the prior art and the underlying portion remained a low quality semiconductor layer. The reason high quality polycrystalline semiconductor layers were not obtained by the prior art was the existence of a large temperature differential between the surface and underlying regions. Elimination of surface damage and the simultaneous relatively uniform melting of the semiconductor layer through essentially the entire thickness results when the intensity of the light in the underlying regions of the semiconductor film is about half or more of the incident light intensity. When this condition is met, the temperature differential between the semiconductor layer surface and underlying regions is minimized. Another horizontal dashed line corresponding to the position at which the light intensity is half of that at the surface has been drawn at 0.5 in FIG. 3. Therefore, the conditions under which the semiconductor film comprised mainly of silicon can be effectively heated and good crystallization can proceed throughout the entire film thickness while avoiding inflicting damage to the semiconductor film is contained in the region within the two dashed lines at 0.9 and 0.5 in FIG. 3. It can be seen that because almost all of the incident light of the XeCl excimer laser of the technology of the prior art is absorbed at the surface of the semiconductor film, the semiconductor film thickness for which the semiconductor layer can be improved by laser irradiation is limited to 1 nm to 4 nm. In contrast, with the conditions of the present invention, melt recrystallization of the solid phase crystallized polycrystalline layer and the accompanying improvement in crystal quality can occur over a wide range of film thickness.

In the present invention, the semiconductor layer region is irradiated with a pulsed laser beam that melts all portions of the film except an extremely thin layer of solid phase crystallized polysilicon at the bottom of the semiconductor film. It is from this residual solid phase polycrystalline layer that crystals are subsequently grown (FIG. 1B). On the other hand, the semiconductor layer melt depth is largely determined by the energy density of the irradiated laser light. However, regardless of the type of laser system, the energy density will fluctuate from shot to shot. Even though using a solid state laser with the present invention results in laser oscillation that is markedly more stable than the technology of the prior art, it is still no exception; and even if the laser is irradiated so as to leave an extremely thin solid phase crystallized polycrystalline layer, slight variations in the energy density can cause completely melted states, where the entire semiconductor layer is melted, to occur with a certain probability. Regardless of the type of laser used, crystals grow along a temperature gradient. The thickness of semiconductor films used for thin film semiconductor devices is normally between about 30 nm and 200 nm. As was described earlier, in conventional crystallization by XeCl excimer laser irradiation, a steep temperature gradient is generated in the vertical direction within the semiconductor film because almost all of the energy is absorbed within 4 nm or so from the surface of the semiconductor film and only the surface region is heated, even if a completely melted state is achieved (a-1 in FIG. 4A). For this reason, crystal nuclei occur in large numbers primarily at the lower interface, and grains grow from the bottom of the semiconductor film toward the top.

The polycrystalline layer obtained following a completely melted state after laser irradiation is thus composed of small grains (a-2 in FIG. 4A). (Because many small grains grow from the bottom toward the top in this fashion using the technology of the prior art, the existence of crystal nuclei resulting from impurities within the semiconductor film were not that big of a problem.) In contrast, with the present invention, because laser irradiation is performed using laser light having the most appropriate absorption coefficient for melt crystallization, the semiconductor film is essentially uniformly heated in the vertical direction throughout the thickness of the film. As a result, a lateral temperature gradient is generated at the edge of the laser irradiated region (b-1 in FIG. 4B), and growth in the lateral direction is easier than growth in the vertical direction. That is, even if the laser energy density varies and the layer falls into a completely melted state, lateral growth comes into effect and large grains grow instead of small grains in the completely melted portion (b-2 in FIG. 4B). Because the vertical temperature differential is also small at locations within the irradiated region away from the edge, the probability of generating crystal nuclei at the bottom of the semiconductor film is significantly reduced over the previous completely melted state; and the grains comprising the polycrystalline semiconductor are also larger in general than those previously. Thus, even if the film falls into a completely melted state, the present invention makes it possible to obtain comparatively large grains through lateral growth. Lateral grain growth proceeds when the laser intensity at the semiconductor layer surface and at the bottom of the film are not that different; and according to experiments, this occurs when the intensity at the bottom of the semiconductor film is one third or higher than the intensity of the incident beam. A dashed line is drawn in FIG. 3 at the position of 0.667 to mark the condition at which lateral grain growth can be easily generated. Therefore, the conditions under which the solid phase crystallization film comprised mainly of silicon can be effectively heated and lateral grain growth can initiate even for complete melting and form large grain size polycrystalline semiconductor films is contained in the region within the two dashed lines at 0.9 and 0.667 in FIG. 3. Of course, in order to have the growth of large grains, in addition to the temperature gradient discussed above, it is also necessary to suppress crystal nuclei originating from impurities; and thus the aforesaid considerations must be taken into account for semiconductor film deposition and so forth in the underlevel protection layer and semiconductor film formation processes.

Looking at FIG. 3, it can be seen that even if the absorption coefficient is between approximately $10^{-3}$ nm$^{-1}$ and $10^{-2}$ nm$^{-1}$, it is not possible to obtain superior polycrystalline films for all semiconductor film thicknesses. For example, for the YAG 2ω (absorption coefficient $\mu_{pSi}$=4.26× $10^{-3}$ nm$^{-1}$), the silicon film can be effectively heated when the thickness of the semiconductor film is about 25 nm or greater; and the entire film thickness can be essentially uniformly heated without damage to the surface when the thickness of the semiconductor film is about 165 nm or less. Further, even when the film is completely melted, the initiation of lateral grain growth and the growth and maintenance of large grains occurs when the thickness of the semiconductor film is about 95 nm or less. Consequently, the desirable film thickness for the irradiation of a solid phase crystallization film comprised mainly of silicon with the YAG 2ω laser beam is between approximately 25 nm and 165 nm; and ideally the thickness should be between approximately 25 nm and 95 nm. In this manner, the optimum semiconductor film thickness varies in response to the wavelength and absorption coefficient in the polycrystalline silicon for the laser beam used. Specifically, for the silicon film to be effectively heated and for it to be heated essentially uniformly across the entire film thickness without surface damage, letting x in Equation 1 be the semiconductor film thickness d, the conditions satisfy an $I_{(d)}/I_{(0)}$ between 0.5 and 0.9.

$$0.5 < I_{(d)}/I_{(0)} < 0.9 \quad \text{(Equation 2)}$$

Using Equation 1 in Equation 2 and solving for d (nm) yields $$0.105 \cdot \mu_{pSi}^{-1} < d < 0.693 \cdot \mu_{pSi}^{-1} \quad \text{(Equation 3)}.$$

Similarly, for the silicon film to be effectively heated and the initiation of lateral grain growth to form and maintain large grains, $I_{(d)}/I_{(0)}$ is between 0.667 and 0.9 and therefore, $$0.405 \cdot \mu_{pSi}^{-1} < d < 0.693 \cdot \mu_{pSi}^{-1} \quad \text{(Equation 4)}.$$

When the semiconductor film thickness d (nm) and the polycrystalline silicon absorption coefficient $\mu_{pSi}$ (nm$^{-1}$) of the pulsed laser beam used to irradiate the semiconductor film satisfy Equations 3 and 4 above, it is possible to produce superior crystalline semiconductor thin films and consequently superior thin film semiconductor devices.

Figure 5:
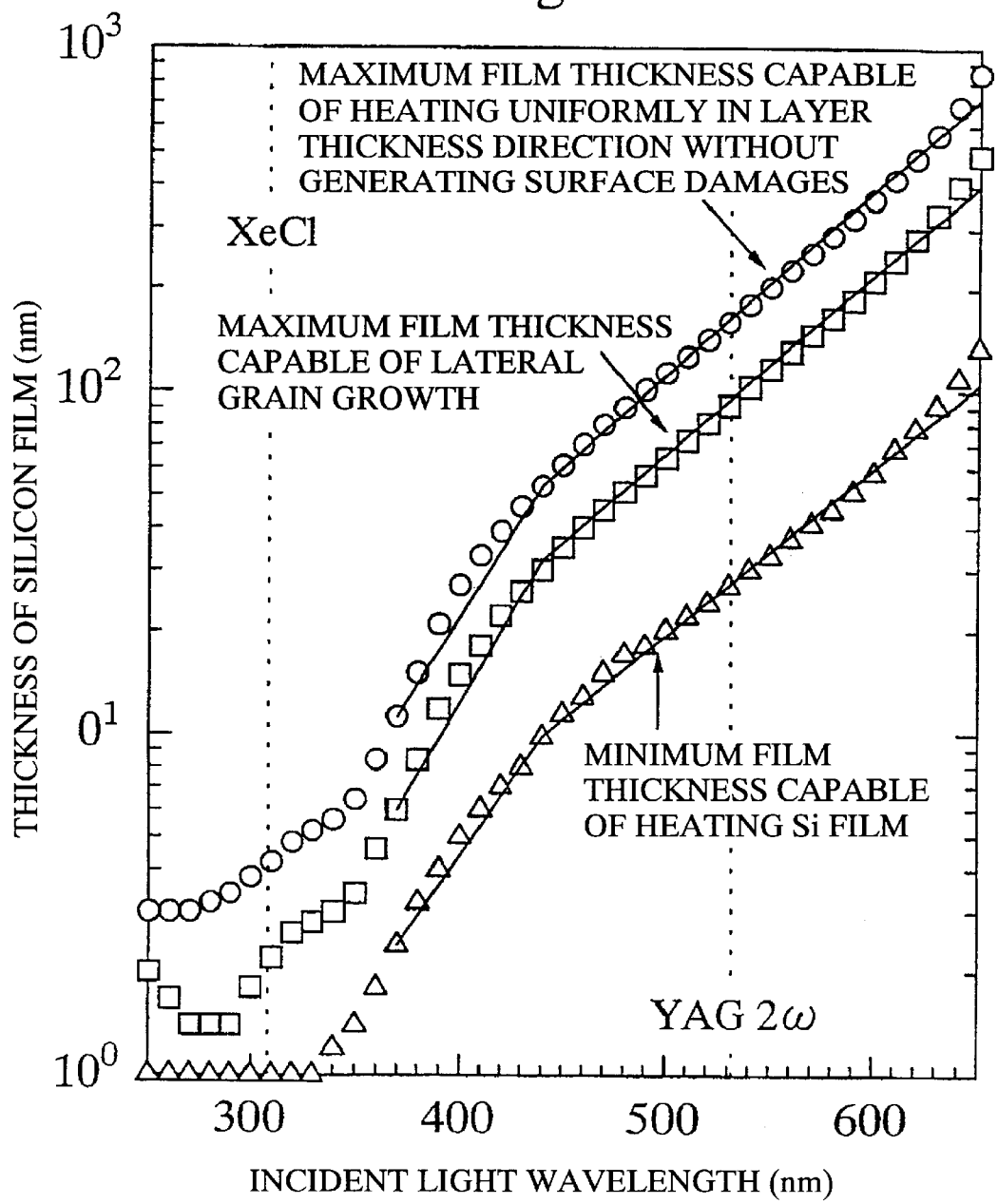
FIG. 5 is a figure showing the relationship between semiconductor film thickness and wavelength that explains the scope of the present invention.

Taking the relationship between wavelength and absorption shown in FIG. 2 into account, the relationships described above in Equations 3 and 4 are replotted in FIG. 5 in terms of the relationship between wavelength and the thickness of the semiconductor thin film comprised mainly of silicon. The region above the open triangles in FIG. 5 is the region in which the semiconductor thin film is heated, and the region below the open circles in FIG. 5 is the region in which the irradiation energy density is such that there is no surface damage and the entirety of the semiconductor film thickness is relatively uniformly melted. Additionally, because the temperature differential between the top and bottom of the film is minimal in the region shown below the open squares in FIG. 5, grain growth can proceed laterally. In FIG. 5, the open circles, open squares, and open triangles can all be approximated by lines. Using these linear fits, for an irradiation wavelength λ between 440 nm and 710 nm, if the wavelength λ and film thickness d satisfy $$9.8 \times 10^{\alpha L2(\lambda - 440)} < d < 53 \times 10^{\alpha H2(\lambda - 440)} \quad \text{(Equation 5)}$$

in which $$\alpha L2 = 4.9 \times 10^{-3} \text{ nm}^{-1}$$

and $$\alpha H2 = 5.4 \times 10^{-3} \text{ nm}^{-1},$$

the semiconductor thin film consisting mainly of silicon can be effectively heated and essentially the entire thickness of the semiconductor film can be uniformly heated without causing surface damage. For example, using the YAG 2ω for the laser, the semiconductor film thickness which satisfies these conditions is between 28 nm and 166 nm because the YAG 2ω wavelength is 532 nm. Further, if the film thickness d and wavelength λ satisfy $$9.8 \times 10^{\alpha L2(\lambda - 440)} < d < 32 \times 10^{\alpha H2(\lambda - 440)} \quad \text{(Equation 6)}$$

in which $$\alpha L2 = 4.9 \times 10^{-3} \text{ nm}^{-1}$$

and $$\alpha M2 = 5.2 \times 10^{-3} \text{ nm}^{-1},$$

the situation is even more favorable because the semiconductor thin film consisting mainly of silicon can be effectively heated and grain growth can proceed laterally for complete melting. If the YAG 2ω wavelength is used, a semiconductor film thickness between 28 nm and 96 nm satisfies the condition in Equation 6.

Similarly, for an irradiation wavelength λ between 370 nm and 440 nm, if the wavelength λ and film thickness d satisfy $$2.4 \times 10^{\alpha L1(\lambda - 370)} < d < 11.2 \times 10^{\alpha H1(\lambda - 370)} \quad \text{(Equation 7)}$$

in which $$\alpha L1 = 8.7 \times 10^{-3} \text{ nm}^{-1}$$

and $$\alpha H1 = 9.6 \times 10^{-3} \text{ nm}^{-1},$$

the semiconductor thin film consisting mainly of silicon can be effectively heated and essentially the entire thickness of the semiconductor film can be uniformly heated without causing surface damage. If the wavelength λ and film thickness d satisfy $$2.4 \times 10^{\alpha L1(\lambda - 370)} < d < 6.0 \times 10^{\alpha M1(\lambda - 370)} \quad \text{(Equation 8)}$$

in which $$\alpha L1 = 8.7 \times 10^{-3} \text{ nm}^{-1}$$

and $$\alpha M1 = 1.04 \times 10^{-2} \text{ nm}^{-1},$$

the situation is even more favorable because the semiconductor thin film consisting mainly of silicon can be effectively heated and grain growth can proceed laterally for complete melting.

It is also important to control the irradiation energy density of the pulsed laser beam on the semiconductor film in order to obtain high quality crystalline semiconductor thin films. In other words, to produce superior thin film semiconductor devices, control of the irradiation energy density within an appropriate range is essential. First, in order for melt crystallization to occur, it is necessary to have a laser beam having sufficient intensity to melt at least a portion of the irradiated semiconductor film. This is the absolute minimum value of the appropriate range for the irradiation energy density of the pulsed laser beam on the surface of the semiconductor film. [Because this usually corresponds to the irradiation energy density for melting of the extreme surface layer, this value is referred to as the "surface melting energy density" ($E_{SM}$) in the present patent disclosure.] Next, experiments have shown that high quality crystalline semiconductor films can be obtained when the pulsed laser beam energy density is able to melt a volume fraction of ⅔ or greater of the thickness of the irradiated semiconductor film. As a result, thin film semiconductor devices which use such crystalline semiconductor films for the active layer display excellent electrical characteristics. This is because high quality crystalline films can be easily obtained by repeatedly, even when the number of irradiation repetitions is low, melting ⅔ or more of the semiconductor film thickness by making use of the fact that the pulsed laser beam of the present invention preferentially melts the film beginning at locations of structural disorder such as those in the non-crystalline regions existing within the solid phase crystallized polycrystalline layer, simultaneously selectively leaves the high quality crystalline component, and also allows essentially the entire thickness of the thin film to melt uniformly. Consequently, a better lower limit is the irradiation energy density which produces melting of a volume fraction of ⅔ or more of the thickness of the semiconductor film. This irradiation energy density is referred to as the "⅔ melting energy density" ($E_{2/3}$) in the present patent disclosure.

There is also a maximum value for the appropriate irradiation energy density. If the laser beam energy density on the surface of the semiconductor film is too high, the semiconductor film is ablated; and naturally it is necessary to keep the energy density less than the value at which ablation occurs. [The irradiation energy density for ablation is referred to as the "ablation energy density" ($E_{Ab}$) in the present patent disclosure.] This value is the absolute maximum. Further, even when ablation does not occur across the entire surface, localized ablation of the semiconductor layer can occur easily if the entire thickness of the semiconductor film is completely melted. [This irradiation energy density is referred to as the "complete melting energy" ($E_{CM}$) in the present patent disclosure.] Because these areas lead to defects during the production of thin film semiconductor devices and therefore result in yield losses, they are obviously not desirable. Additionally, if there is complete melting of the thickness of the semiconductor film over a wide range, the microcrystallization accompanying complete melting cannot be offset by lateral growth and the crystalline semiconductor layer resulting from the laser irradiation will be composed of a large amount of microcrystals. When this occurs, the result is undesirable electrical characteristics in the thin film semiconductor devices. Consequently, for the production of high quality thin film semiconductor devices with high yields, a value of the pulsed laser beam energy density at the surface of the semiconductor which is slightly lower than the value for complete melting of the thickness of the semiconductor film ($E_{CM}$) is desirable. This value becomes the desirable upper limit for the appropriate irradiation energy density.

Figure 6:
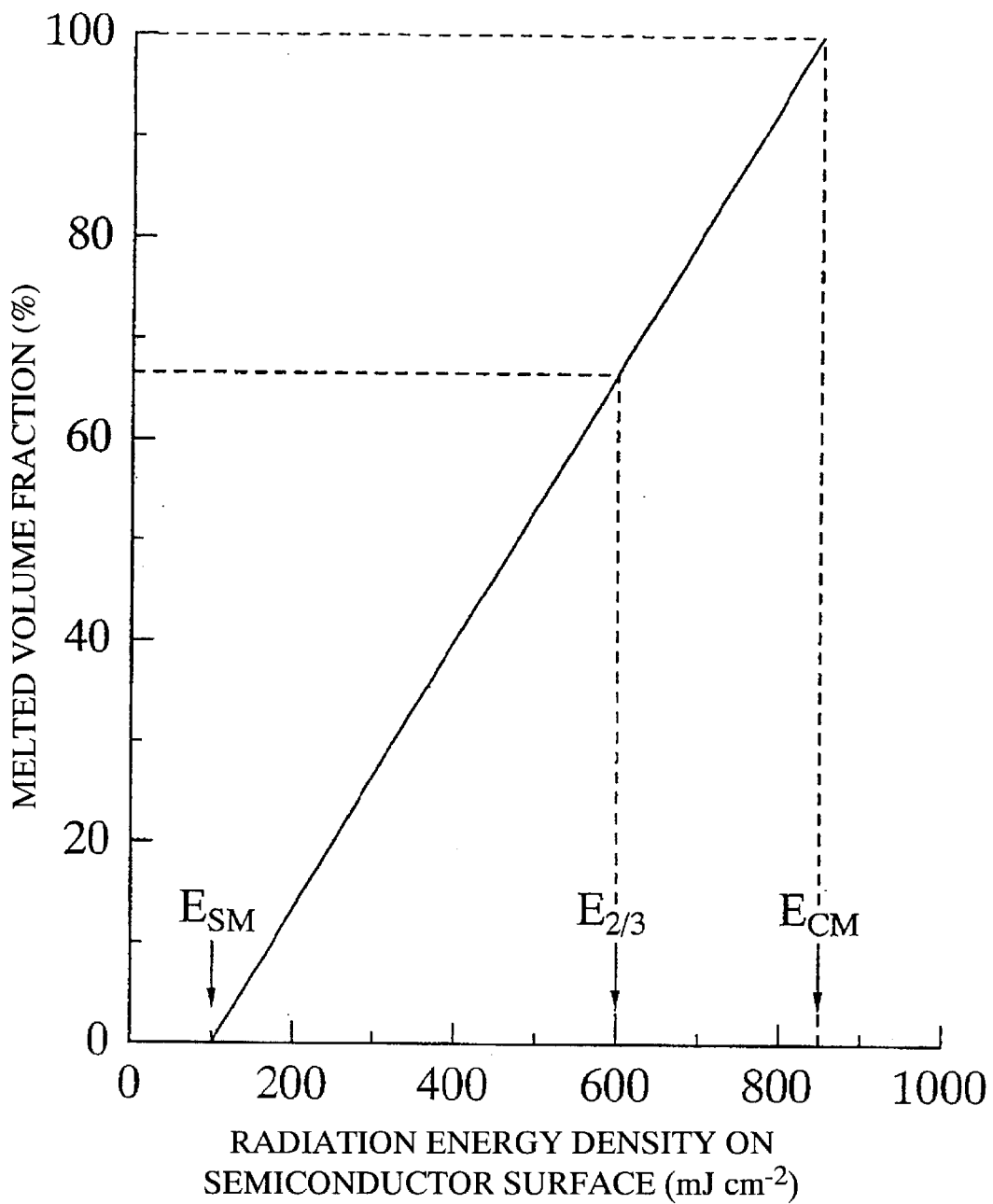
FIG. 6 is a figure that shows the relationship between a typical energy density of the present invention and the volume fraction.

Ultimately then, when producing thin film semiconductor devices by irradiating solid phase crystallized polycrystalline semiconductor films composed mainly of silicon and satisfying the thickness requirements presented in Equations 5 through 8 using a solid-state laser with a wavelength between 370 nm and 710 nm, the preferred irradiation energy density of the solid-state laser on the semiconductor film is greater than the surface melting energy density ($E_{SM}$) and less than the ablation energy density ($E_{Ab}$). Actually a more desirable value is greater than the surface melting energy density ($E_{SM}$) and less than the complete melting energy density ($E_{CM}$), or greater than the ⅔ melting energy density ($E_{2/3}$) and less than the ablation energy density ($E_{Ab}$). Ideally, this value is greater than the ⅔ melting energy density ($E_{2/3}$) and less than the complete melting energy density ($E_{CM}$). Specifically, for the case of the second harmonic of the solid-state pulsed Nd:YAG laser and a semiconductor film thickness between about 28 nm and 96 nm for a semiconductor film composed mainly of silicon on a transparent substrate, the relationship between the YAG 2ω pulsed laser beam irradiation energy density on the surface of the semiconductor film (x-axis) and the volume fraction of the irradiated semiconductor film which is melted (y-axis) is shown in FIG. 6. As can be seen from FIG. 6, under the conditions described above $$E_{SM}=100 \text{ mJ·cm}^{-2}$$

$$E_{CM}=850 \text{ mJ·cm}^{-2}$$

$$E_{Ab}=1500 \text{ mJ·cm}^{-2}$$

and the irradiation energy density for melting a volume fraction of ⅔ of the thickness of the irradiated semiconductor film is $$E_{2/3}=600 \text{ mJ·cm}^{-2}.$$

Therefore, the desirable irradiation energy density for the YAG 2ω on the semiconductor film is greater than 100 mJ·cm$^{-2}$ and less than 1500 mJ·cm$^{-2}$. A more desirable value is greater than 100 mJ·cm$^{-2}$ and less than 850 mJ·cm$^{-2}$, and ideally, the value will be greater than 600 mJ·cm$^{-2}$ and less than 850 mJ·cm$^{-2}$.

The laser irradiation step of the present invention is intended to greatly reduce the number of crystal defects without changing the size of the grains in the original solid phase crystallization film by using a pulsed laser beam to irradiate the solid phase crystallized polycrystalline semiconductor film composed of large grains, even though the film contains a large number of crystal defects. For this reason, it is desirable to use a solid state laser having superior oscillation stability, and to fire at a slightly lower energy density than the complete melting energy density a laser beam having an absorption coefficient in the non-crystalline components that is larger than the absorption coefficient in the crystalline components.

If the relationship between absorption coefficient and semiconductor film thickness is optimized, grains of between about 1 μm and 3 μm will occur by means of lateral growth even if complete melting should occur, thus preventing microcrystallization.

Figure 7A:
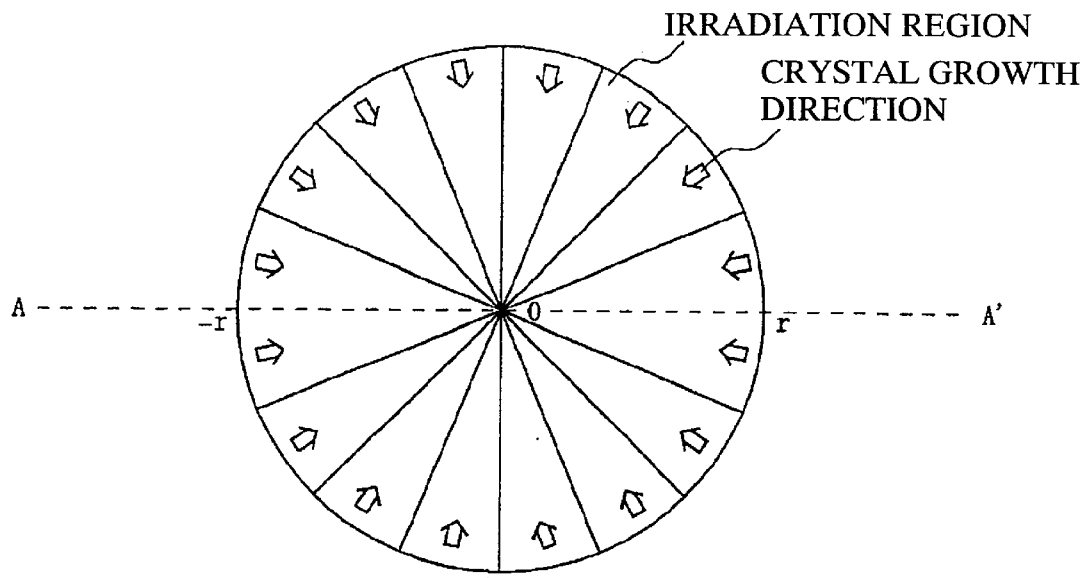
FIGS. 7A and 7B are figures that show a laser beam irradiation profile.
Figure 7B:
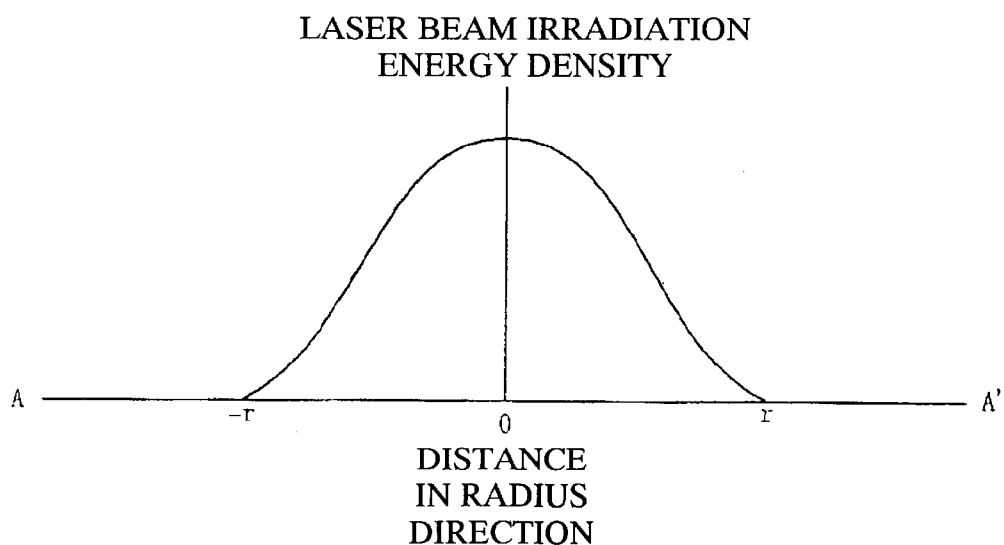
Figure 8A:
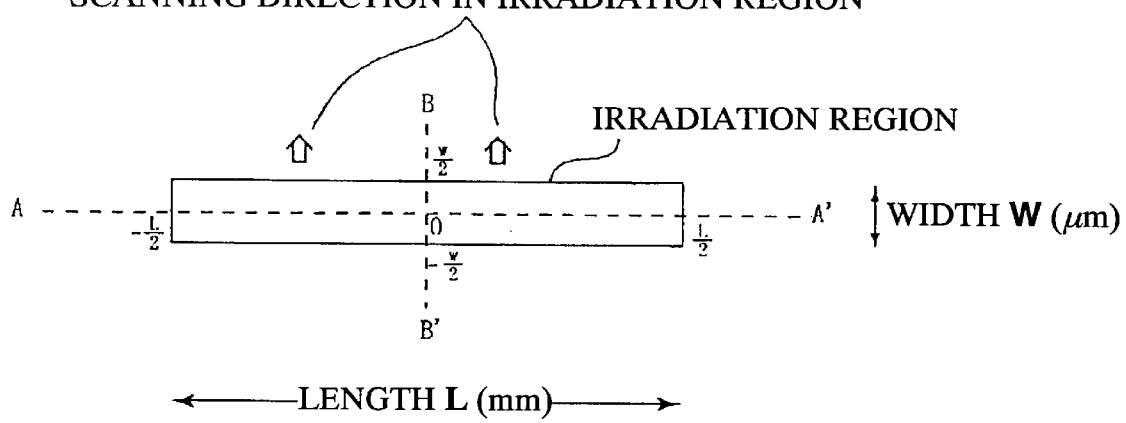
FIGS. 8A and 8B are figures that show a laser beam irradiation profile of the present invention.

In order to make effective use of lateral grain growth when the film has fallen into a completely melted state, it is also important to control the profile of the pulsed laser beam irradiation region on the surface of the semiconductor film in addition to the other conditions which have been mentioned above. For example, consider the case of a circular beam profile for the irradiation region as shown in FIG. 7A in which the laser intensity decreases from the center to the periphery (FIG. 7B). Because the grains grow from the low temperature periphery to the high temperature center in such a case, the grains will collide as they grow; and the result is that a large grain size is not obtained. Additionally, regardless of the direction of the active region (the source—channel—drain direction for FETs and the emitter—base—collector direction for bipolar transistors) of the semiconductor devices, there will inevitably be many grain boundaries within the active region so that even if the thin film semiconductor devices are produced with laser annealing, superior semiconductor devices will not be obtained with such an irradiation region beam profile. In contrast, the irradiation region in the present invention assumes a linear or essentially rectangular profile with a width W (μm) and length L (mm) (FIG. 8A).

Figure 8B:
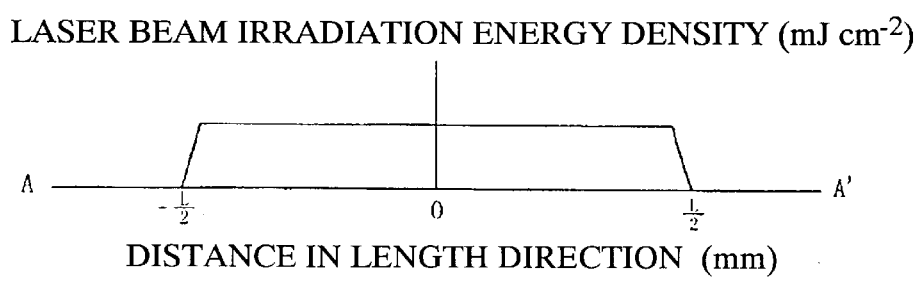
Figure 9A:
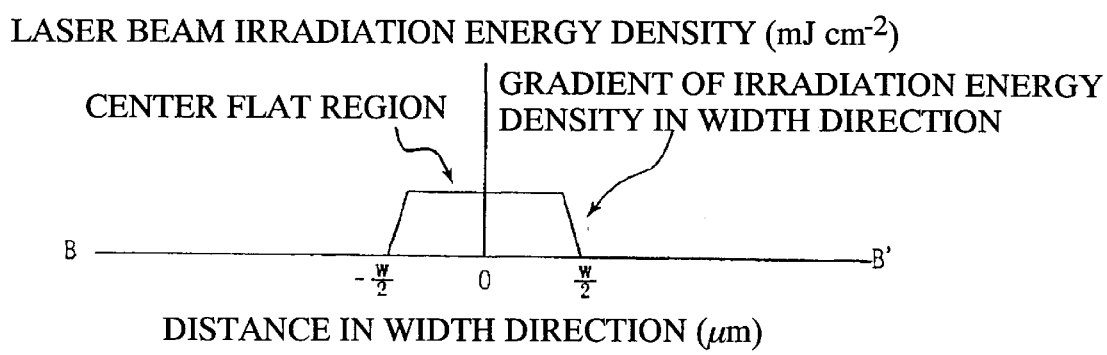
FIGS. 9A and 9B are figures that show a laser beam irradiation profile of the present invention.
Figure 9B:
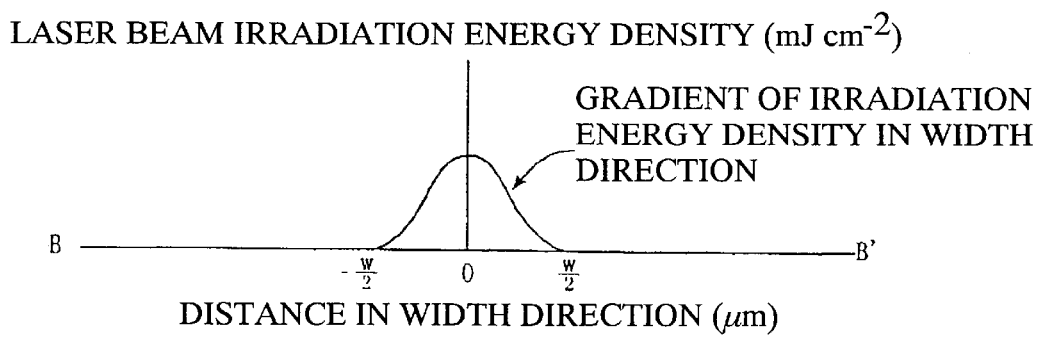
Figure 10A:
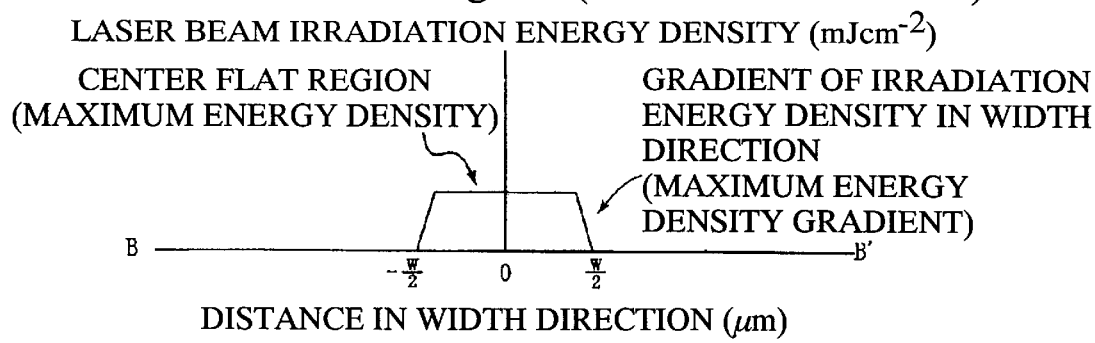
FIG. 10 is a figure that shows a laser beam irradiation profile of the present invention.
Figure 10B:
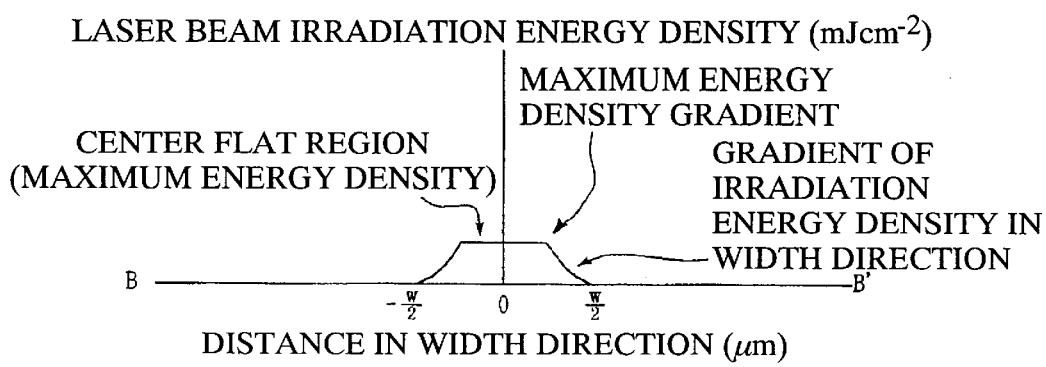

The laser irradiation energy density along a lengthwise cross-section of the irradiation region (cross-section A-A' in FIG. 8A) is essentially uniformly distributed (FIG. 8B) except at the edges of the irradiation region (near ±L/2 in FIG. 8B) (FIG. 8B). Specifically, except for 5% at the left and right edges respectively along the length, the energy density variation (the ratio of the standard deviation with respect to the mean) within the central 90% is less than about 5%. On the other hand, the laser irradiation energy density along a widthwise, or lateral, cross-section of the irradiation region (cross-section B-B' in FIG. 8A) is essentially a trapezoid (FIG. 9A) or a Gaussian profile (FIG. 9B). When the lateral cross-section is Gaussian, this means not only that the laser intensity in the lateral direction (FIG. 9B) actually assumes a profile approximating a Gaussian distribution, but also that the intensity decreases smoothly from the center (the 0 point in FIG. 9B) to the edge regions (the areas near ±W/2 in FIG. 9B) as a differentiable function. When the lateral cross-section has a trapezoidal profile (FIG. 9A), it is desirable for the central flat region which has a variation in the energy density distribution of less than about 5% to account for from 30% to 90% of the total profile, which means that the upper and lower edge regions each account for between 5% and 35%. For example, if W=100 μm, it is desirable for the central flat region to be from 30 μm to 90 μm and each of the upper and lower edge regions to be from 5 μm to 35 μm. To effectively reduce the number of defects in the solid phase crystallized semiconductor layer and to prevent microcrystallization through lateral growth even if complete melting should occur, it is desirable that the position at which the maximum value of the widthwise irradiated energy density gradient is achieved and the position at which the maximum value of lateral irradiation energy density is achieved are essentially coincident. This is because complete melting occurs where the irradiated energy density is at the maximum position and, if the irradiated energy density gradient in that place is at the maximum, lateral growth is most greatly accelerated. The widthwise cross-section that can be said to be ideal in the present invention is a laser beam intensity distribution that is either trapezoidal (FIG. 10A) or mimics the profile of trapezoid with concave sides (FIG. 10B).

To effect lateral growth when the semiconductor film has been completely melted, in addition to the suppression of grain growth in the direction of the film thickness by means of the choice of the laser source and the matching semiconductor film thickness, control of film growth in the horizontal direction is also important. Specifically, through the optimization of the ratio (L/W) of the length L (abbreviated as the "irradiation length") of the linear or rectangular laser beam irradiation region to the width W of the same region (abbreviated as the "irradiation width") as well as the irradiation region scanning scheme, it is possible to produce grain growth in the desired direction. First assume an irradiation length to irradiation width ratio (L/W) of 100 or higher. If the (L/W) ratio is higher than about 100, with each laser shot, the temperature gradient along the irradiation length is essentially non-existent and most of the gradient exists in the lateral direction (direction B-B' in FIG. 8A). As a result, the grains exhibit one-dimensional lateral growth along the width of the irradiation region. Because it is preferable to have the irradiation width between about 5 μm and 500 μm, a ratio (L/W) of 100 or higher, and ideally 1000 or higher is desirable from a throughput perspective. Next, the irradiation region with the profile described is translated in the lateral direction with each laser shot and scans the entire surface of the substrate. Because the grains grow laterally along the irradiation width when completely melted, it is possible for multiple grains to coalesce in the lateral direction if the irradiation region is translated laterally. By using this type of irradiation scheme, the grains which compose the ultimately obtained crystalline semiconductor film become large on average along the irradiation region width (direction B-B' in FIG. 8A). Consequently, by taking the direction of the active region of the thin film semiconductor devices (the source—drain direction for MOSFETs and the emitter—collector direction for bipolar transistors) to be in the direction of the irradiation width, it is possible to realize superior thin film semiconductor devices with either no or very few grain boundaries within the active region (within the MOSFET channel formation region or the bipolar transistor emitter—base junction region, base region and the base—collector junction region).

In scanning the laser irradiation region over the substrate, it is desirable for the amount of translation of the irradiation region with each laser shot (this is abbreviated as the "amount of translation") to be less than the amount of grain growth from a single laser shot (this is abbreviated as "grain growth size"). The ideal amount of translation is on the order of half of the grain growth size or less. This is because by so doing, the probability of grains coalescing in the direction of the active region of the thin-film semiconductor devices increases dramatically, even if laser shots at a laser energy density that causes complete melting are consecutively repeated a number of times. When the YAG 2ω is used as the laser source, the grain growth size is usually on the order of 1 μm to 3 μm. Therefore, if the amount of translation is on the order of 3 μm or less, there is a possibility that the grains will coalesce; and the probability that this will happen is even higher if the amount of translation is 2 μm or less. It is not the case that the grain growth size is always about 3 μm, and the grain growth size is distributed according to a given probability function. While the grain growth size will sometimes take on a large value, there are also cases where it can assume a small value. Even if the grain growth size is small, such as on the order of 1 μm, in order for the grains to definitely coalesce, or in other words for the grains to definitely coalesce regardless of the value of the grain growth size, the amount of translation should be on the order of 1 μm or less. Ideally the value should be 0.5 μm or less. If the amount of translation is less than about 0.1 μm, the scanning speed slows to less than 2 mm/sec even though the pulse frequency of the YAG 2ω may be as high as 20 kHz. For processing large size substrates on the order of 500 mm in size, a scanning speed of less than about 2 mm/sec is not realistic from a throughput perspective. Therefore, the minimum value for the amount of translation can be said to be about 0.1 μm. If throughput takes precedence over the coalescence of grains, the maximum value for the amount of translation is roughly 25 μm.

In the fabrication of high quality thin film semiconductor devices, it is necessary to optimize the number of times a given location on the semiconductor film is irradiated by the pulsed laser beam (abbreviated as the "number of laser shots"). If the number of laser shots is less than about 10, it is not possible to effectively reduce the number of defects within the solid phase crystallized polycrystalline semiconductor film. On the other hand, a number of laser shots greater than about 80 results in problems such as the incorporation of gas impurities into the semiconductor film and a significant increase in the roughness of the semiconductor film surface. Especially if the number of laser shots is 200 or greater, the surface becomes extremely rough. If films of this type are used to fabricate thin film semiconductor devices, the semiconductor devices are completely non-functional as a result of problems such as gate leak. In order to fabricate high quality thin film semiconductor devices while effectively decreasing the defects within the crystalline semiconductor films and also maintaining a level semiconductor film surface, the laser irradiation region should scan the substrate such that the number of laser shots is between about 10 and 80. To assure such high quality semiconductor devices, the pulsed laser beam should scan so that the number of laser shots is between about 20 and 60.

Because there are optimum values for the amount of translation and the number of laser shots, the optimum irradiation width W is determined by these values. The irradiation width W is the product of the amount of translation and the number of laser shots. If the amount of translation is x ($\mu$m) and the number of laser shots is n, the irradiation width W ($\mu$m) is $$W(\mu m)=x(\mu m)\times n \quad \text{(Equation 9)}.$$

Regardless of the distribution of the laser energy density along the width, the irradiation width W corresponds to the width at the point at which the intensity of the laser energy density is half of its maximum value (full width half maximum: FWHM). Because the lower limit for the desired range for the amount of translation is about 0.1 $\mu$m and the desirable minimum for the number of laser shots is about 10, the desirable minimum irradiation width is about 1 $\mu$m. Conversely, because the maximum value for the amount of translation is about 25 $\mu$m and the maximum value for the number of laser shots is about 80, the desirable maximum irradiation width is about 2000 $\mu$m. A more desirable range for the irradiation width is between 5 $\mu$m, corresponding to an amount of translation of 0.5 $\mu$m and a number of laser shots of 10, and 240 $\mu$m, corresponding to an amount of translation of 3 $\mu$m and a number of laser shots of 80. The ideal irradiation width is between 20 $\mu$m, corresponding to an amount of translation of 1.0 $\mu$m and a number of laser shots of 20 or an amount of translation of 0.5 $\mu$m and a number of laser shots of 40, and 120 $\mu$m, corresponding to an amount of translation of 2 m̀ and a number of laser shots of 60. For connecting grains formed through lateral growth in complete melting with each shot, it is desirable for the irradiation width W to be less than 6 m̀ which is twice the maximum lateral growth distance of 3 m̀.

Under these conditions, the desirable laser pulse frequency matches the order of the scanning speed of 2 mm/sec or higher. Using the previously defined amount of translation x ($\mu$m), the relationship between the pulsed laser beam pulse frequency f (Hz) and the scanning speed v (mm/sec) can be expressed as $$v(\text{mm/sec})=x(\mu m)\times 10^{-3}\times f(\text{Hz}) \quad \text{(Equation 10)}.$$

Therefore, the desirable pulse frequency f (Hz) is $$f>2\times 10^3/x \quad \text{(Equation 11)}.$$

Because the desirable range for the amount of translation is between about 0.1 $\mu$m and 25 $\mu$m, the desirable pulse frequency range from Equation 11 is from about 0.08 kHz to 20 kHz. A more desirable range is from about 0.67 kHz to 20 kHz, and an ideal range is from about 1 kHz to 20 kHz. From Equation 9 and Equation 11, the relationship among the pulse frequency f (Hz), the number of laser shots n (number) and the irradiation width W ($\mu$m) can be seen to be $$f>2\times 10^3\times n/x \quad \text{(Equation 12)}.$$

In other words, by setting the pulse frequency, number of laser shots and irradiation width to satisfy the condition in Equation 12 and irradiating the semiconductor film with a pulsed laser, it is possible to produce superior quality thin film semiconductor devices with high throughput.

One additional important factor in effecting one dimensional lateral growth of grains along the width during complete melting of semiconductor films is the gradient of the laser energy density along the width of the irradiation region (abbreviated as the "energy density gradient.") The grain growth speed u(x) during melt crystallization is proportional to the semiconductor film temperature gradient dT(x)/dx $$u(x)=k\cdot dT(x)/dx \quad \text{(Equation 13)}$$

in which k is the speed constant, and T(x) is the semiconductor film temperature at a location x on the semiconductor film. Letting the melting time for the semiconductor film be tm, the grain growth size Lc is given by the product of the grain growth speed and the melting time tm $$L_c=u\times t_m=k\cdot dT/dx\cdot t_m \quad \text{(Equation 14)}.$$

Because the speed constant k is fixed and the melting time is also essentially constant, the grain growth size is proportional to the semiconductor film temperature gradient. On the other hand, because the semiconductor film temperature is proportional to the irradiation pulsed laser beam energy density, the grain growth size Lc is ultimately proportional to the energy density gradient dE/dx $$Lc\ dE/dx \quad \text{(Equation 15)}.$$

For the grain growth size to increase, a large energy density gradient is necessary. According to the experimental results of the inventor and others, during complete melt crystallization of semiconductor films on glass substrates using the YAG 2$\omega$ as the pulsed laser source, the grain growth size along the irradiation width was larger than 1 $\mu$m when the maximum value of the energy density gradient was larger than about 3 mJ·cm$^{-2}$·$\mu$m$^{-1}$, being between about 3.0 mJ·cm$^{-2}$·$\mu$m$^{-1}$ and 4.0 mJ·cm$^{-2}$·$\mu$m$^{-1}$. Further, when the maximum value of the energy density gradient was between mJ·cm$^{-2}$·$\mu$m$^{-1}$ and 20 mJ·cm$^{-2}$·$\mu$m$^{-1}$ the grain growth size along the irradiation width was larger than 2 $\mu$m. Also, when the maximum value of the energy density gradient was about 30 mJ·cm$^{-2}$·$\mu$m$^{-1}$, the grain growth size along the irradiation width was about 3 $\mu$m. Therefore, in order to obtain high quality crystalline semiconductor films and produce excellent thin film semiconductor devices, it is desirable to have the maximum value of the energy density gradient greater than about 3 mJ·cm$^{-2}$·$\mu$m$^{-1}$, preferably between 10 mJ·cm$^{-2}$·$\mu$m$^{-1}$ and 20 mJ·cm$^{-2}$·$\mu$m$^{-1}$, and ideally greater than about 30 mJ·cm$^{-2}$·$\mu$m$^{-1}$.

To obtain crystalline semiconductor films having a low occurrence of defects and large grain diameter according to the present invention, a solid phase crystallization film composed from grains of about 2 $\mu$m to about 5 $\mu$m is obtained by optimizing such processes as the amorphous semiconductor film deposition step and the solid phase crystallization step used to crystallize the amorphous semiconductor film thus obtained in the solid phase state. Then, in an irradiation step, using a solid state laser having superior oscillation stability, a laser beam whose absorption coefficient is greater in the amorphous components than in the crystalline components is irradiated at an energy density slightly lower than the complete melt energy density. By so doing, intergranular defects are dramatically reduced while the solid phase crystallization film's grain diameter of about 2 $\mu$m to 5 $\mu$m is maintained. However, regardless of the degree of laser beam stability, the energy density always varies from shot to shot, so the semiconductor film will encounter complete melting at some fixed probability. In the past, this situation would generate microcrystals having an average grain diameter of several dozen nm, but the present invention is able to effect lateral growth of grains in size from about 1 $\mu$m to about 3 $\mu$m and prevent microcrystallization even if complete melting should occur, through the optimization of factors such as the relationship between the absorption coefficients and semiconductor film thickness, the shape of the irradiation region having either a linear or an essentially rectangular profile, the energy density gradient in the lateral direction, and the scanning method in which the irradiation region is translated by a suitable amount in the widthwise direction of the irradiated region after each shot. In this manner, the grain length will markedly increase at least along the irradiation width, making it possible to obtain superior crystalline semiconductor thin films with minimal intragranualar defects, a planar surface, and high purity; and, therefore, leading to the easy fabrication of superior thin-film semiconductor devices.

As has been described in detail above, the present invention can change the low quality, large variation crystalline semiconductor films of the prior art into uniform, high quality crystalline semiconductor films by modifying the amorphous semiconductor film growth method, the step by which the films are crystallized in the solid phase state, and the subsequently performed laser irradiation step. As a result, the electrical characteristics of thin film semiconductor devices exemplified by thin film transistors can be remarkably improved. At the same time, the thin film semiconductor devices can be made to operate at low voltages; and it is possible to reliably produce such thin film semiconductor devices.

EXAMPLES

Practical examples of this invention will be described with reference to the accompanying figures.

Example 1

FIGS. 11A through 11D are cross-sectional representations of the fabrication step of a MOS field effect transistor thin film semiconductor device. In Example 1, a crystalline glass with a strain point of 750° C. is used as substrate 101. In fact, as long as the substrate can withstand the maximum processing temperature present during the fabrication of the thin film semiconductor device, any type and size of substrate can be used. First, a silicon oxide layer functioning as underlevel protection layer 102 is deposited on substrate 101. In the event that the substrate contains impurities which are undesirable in semiconductor films, such as for the case of ceramic substrates, it is desirable to deposit a first underlevel protection layer such as tantalum oxide or silicon nitride prior to deposition of the silicon oxide layer. In this Example 1, a silicon oxide film on the order of 200 nm is deposited on substrate 101 by plasma-enhanced chemical vapor deposition (PECVD) to act as underlevel protection layer 102. The silicon oxide layer was deposited by ECR-PECVD under the following conditions:

| | |
|---|---|
| Monosilane (SiH$_4$) flow rate | 60 sccm |
| Oxygen (O$_2$) flow rate | 100 sccm |
| Pressure | 2.40 mTorr |
| Microwave (2.45 GHz) power | 2250 W |
| Applied magnetic field | 875 Gauss |
| Substrate temperature | 100° C. |
| Deposition time | 40 seconds |

The etching rate of this oxide film was 0.5 nm/sec in a 1.67% aqueous hydrofluoric acid solution at 25° C.

In the semiconductor layer formation step an intrinsic amorphous silicon layer on the order of 50 nm thick was deposited on top of the underlevel protection layer, formed as described above, in a high vacuum LPCVD reactor. The high vacuum LPCVD system is a hot-wall reactor with a volume of 184.5 l and a total surface area for deposition of 44,000 cm$^2$ once the substrates have been introduced into the reactor. The maximum exhaust rate of the deposition chamber is 120 sccm/mTorr. The deposition temperature is 425° C., and the substrates undergo a thermal drying process step at this temperature for 1 hour and 15 minutes prior to deposition of the semiconductor film. In the middle of the thermal drying process step, 200 sccm of at least 99.9999% pure helium (He) and 100 sccm of at least 99.9999% pure hydrogen (H$_2$) are introduced into the deposition chamber containing the substrates; and the deposition chamber is maintained at a pressure of approximately 2.5 mTorr. After the completion of the thermal drying process step, the background pressure of the deposition chamber just prior to deposition of the semiconductor layer is $2.5 \times 10^{-7}$ Torr under the equilibrium temperature conditions at 425° C. During deposition of the amorphous silicon layer, at least 99.99% pure disilane (Si$_2$H$_6$) is supplied at a flow rate of 200 sccm; and the deposition pressure is maintained at roughly 1.1 Torr. The deposition rate of the silicon film is 0.77 nm/min under these deposition conditions (semiconductor film formation process complete).

Next, the amorphous semiconductor film thus obtained was annealed, crystallizing it in the solid phase. The amorphous semiconductor film was annealed at 600° C. for 24 hours in a gas mixture of 99% nitrogen and 1% oxygen at atmospheric pressure. The annealing step changed the semiconductor film from an amorphous state to a polycrystalline state (solid phase crystallization step complete).

Figure 11A:
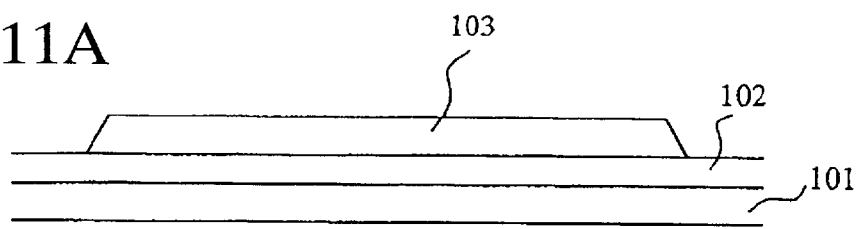
FIGS. 11A through 11D are figures that explain the fabrication step of the present invention.

Next, in the laser irradiation step, the solid phase growth intrinsic amorphous silicon layer obtained in the solid phase crystallization step is melt crystallized by irradiation with the second harmonic of a pulsed Nd:YAG laser. The time half-width of the pulsed laser is approximately 60 nanoseconds, and the pulse frequency is 200 Hz. The laser pulse has an approximately Gaussian distribution along its width, and the beam is focussed into a line profile having an irradiation width of 270 $\mu$m and an irradiation length of 10 mm. The maximum in the energy density gradient along the width of the pulse is 3.72 mJ·cm$^{-2}$·$\mu$m$^{-1}$. The laser line profile is scanned over the substrate by translating the beam 2.5% along its width after each irradiation. The amount of translation is 6.75 $\mu$m so that a given point on the semiconductor film is irradiated approximately 40 times. The irradiation energy density of the laser is 700 mJ·cm$^{-2}$. The variation of the average irradiation energy density at the surface of the semiconductor layer is roughly 4%. In this Example 1, because the energy density for melting only the extreme surface of the 50 nm semiconductor layer using the YAG 2ω laser was 100 mJ·cm$^{-2}$ whereas the energy density for complete melting was 850 mJ·cm$^{-2}$, approximately 80% of the semiconductor layer was melted. The crystalline silicon layer thus obtained was then patterned to produce semiconductor layer island 103. The direction of the transistor source and drain and the scanning direction of the YAG 2ω laser were roughly parallel (laser irradiation step complete) (FIG. 11A).

Next, silicon oxide layer 104 was formed by ECR-PECVD in order to cover patterned semiconductor layer island 103. This silicon oxide layer serves as the gate insulator layer for the semiconductor device. With the exception of a shortened deposition time of 24 seconds, the deposition conditions of the gate insulator silicon oxide layer are the same as the deposition conditions of the underlevel protection layer silicon oxide layer.

Immediately prior to the deposition of the silicon oxide layer, however, the substrate was irradiated by an oxygen plasma inside the ECR-PECVD reactor to create a low temperature plasma oxide layer on the surface of the semiconductor layer. The plasma oxidation conditions are as given below:

| | |
|---|---|
| Oxygen (O$_2$) flow rate | 100 sccm |
| Pressure | 1.85 mTorr |
| Microwave (2.45 GHz) power | 2000 W |
| Applied magnetic field | 875 Gauss |
| Substrate temperature | 100° C. |
| Deposition time | 24 seconds. |

Figure 11B:
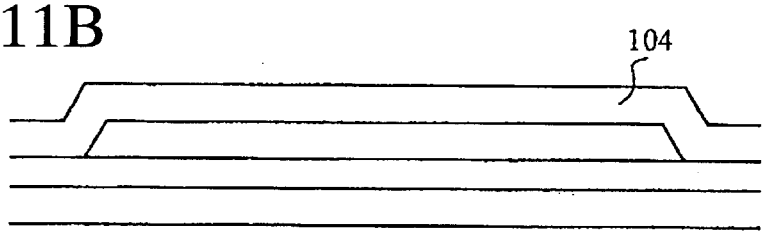

As a result of the plasma oxidation, a roughly 3.5 nm oxide layer is formed on the surface of the semiconductor layer. Following completion of the oxygen plasma irradiation, the oxide layer is deposited in a consecutive fashion without breaking vacuum in the system. Consequently, the silicon oxide layer that comprises the gate insulator is composed of both a plasma oxide layer and a vapor deposited layer with a total thickness of 119 nm. Gate insulator layer formation is completed in this manner (FIG. 11B).

Figure 11C:
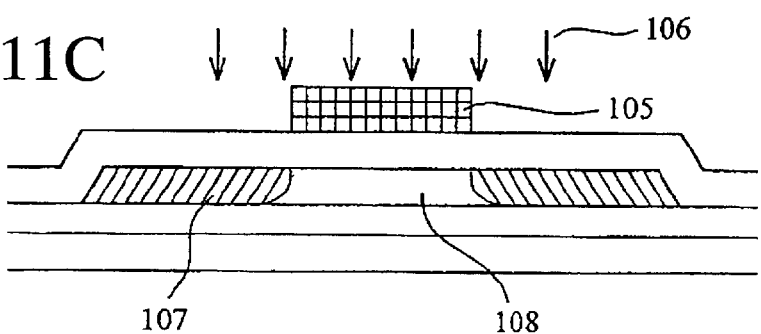

Next, gate electrode 105 comprised of a metal thin film is formed by sputtering. The substrate temperature during sputtering was 150° C. In this Example 1, the gate electrode was formed by a 750 nm thick alpha tantalum (Ta) film with a sheet resistivity of 0.8 Ω/square. Next, using the gate electrode as a mask, donor or acceptor impurity ions 106 are implanted in order to form source and drain regions 107 and channel region 108 in a self-aligned manner with respect to the gate electrode. In this Example 1, CMOS semiconductor devices were fabricated. During formation of the NMOS transistors, the PMOS transistor regions were covered by a thin film of aluminum (Al); and phosphine (PH$_3$), chosen as the source of impurity ions and diluted to a concentration of 5% in hydrogen, was implanted into the NMOS source and drain regions at an accelerating voltage of 80 kV to produce a total ion concentration, including hydrogen, of 7×10$^{15}$ cm$^{-2}$. On the other hand, during formation of the PMOS transistors, the NMOS transistor regions were covered by a thin film of aluminum (Al); and diborane (B$_2$H$_6$), chosen as the source of impurity ions and diluted to a concentration of 5% in hydrogen, was implanted into the PMOS source and drain regions at an accelerating voltage of 80 kV to produce a total ion concentration, including hydrogen, of 5×10$^{15}$ cm$^{-2}$ (FIG. 11C). The substrate temperature during implantation was 300° C.

Figure 11D:
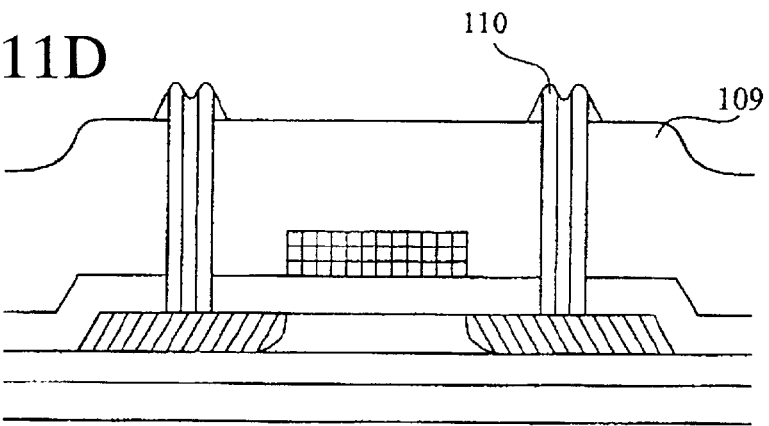

Next, interlevel dielectric layer 109 was deposited at a substrate temperature of 300° C. by PECVD using TEOS (Si—(OCH$_2$CH$_3$)$_4$) and oxygen as the source gases. The interlevel dielectric layer is comprised of silicon dioxide and has a thickness of approximately 500 nm. After interlevel dielectric layer deposition, the devices are annealed in a nitrogen atmosphere at 300° C. for four hours in order to both densify the interlevel dielectric layer and also activate the impurity elements residing in the source and drain regions. Finally, contact holes are opened; aluminum is sputter deposited at a substrate temperature of 180° C.; interconnects 110 are formed; and the thin film semiconductor device is completed (FIG. 11D).

Figure 12:
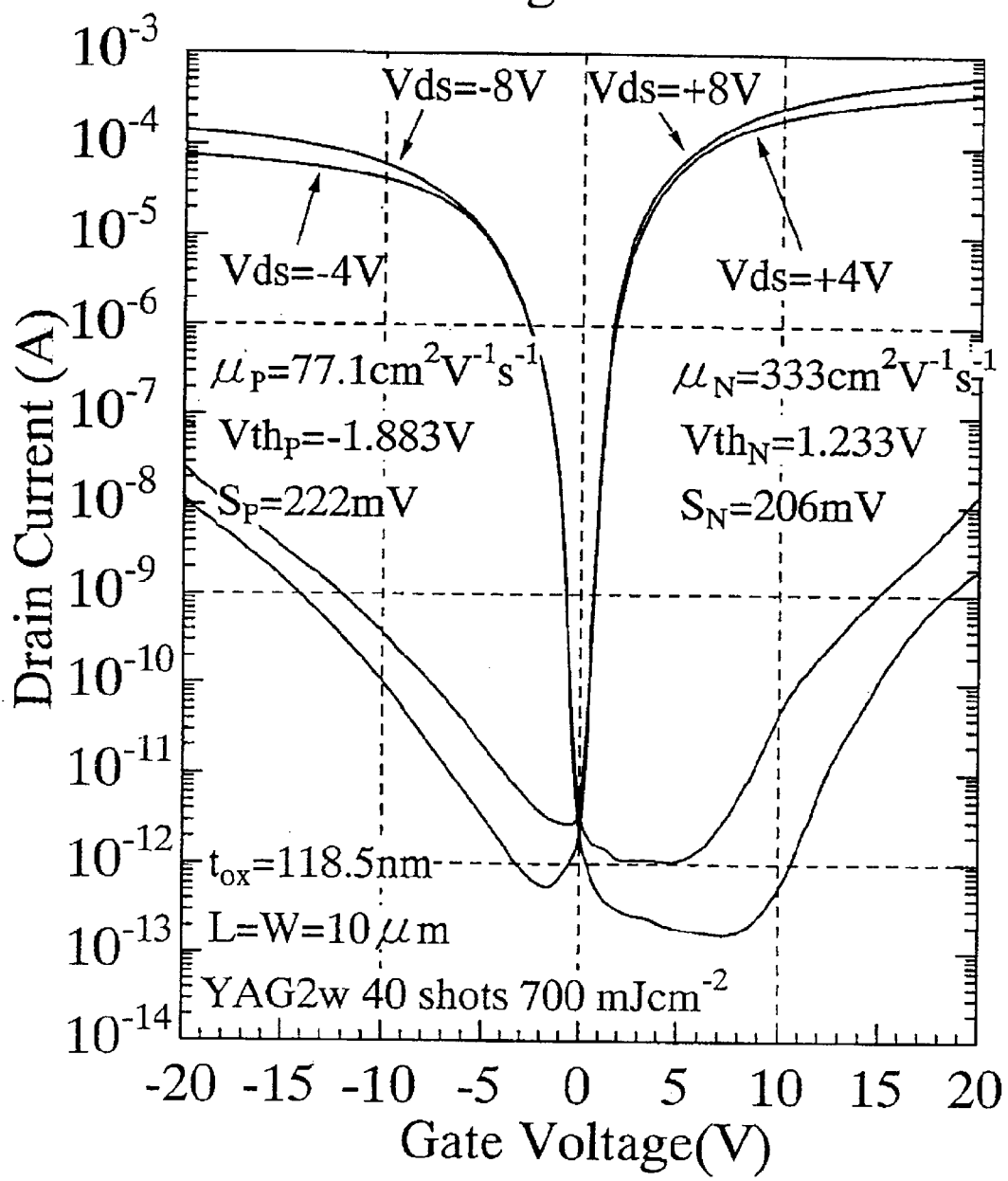
FIGS. 12 through 20 are figures that explain the effect of the present invention.

The transfer characteristics of thin film semiconductor devices fabricated in the manner described above were measured. The channel region of the measured semiconductor devices was 10 μm in both length and width; and the measurements were performed at room temperature. An example is shown in FIG. 12. For NMOS transistors measured with Vds=8 V, the mobility (saturation mobility) determined from the saturation region was 333 cm$^2$·V$^{-1}$·sec$^{-1}$, the threshold voltage was 1.23 V, the subthreshold swing was 0.206 V, and the density of acceptor-like states determined from the threshold voltage and flat band voltage was 8.56×10$^{15}$ cm$^{-3}$. Moreover, on-current defined at Vds=Vgs=4 V was 2.96×10$^{-5}$ A, and off-current at Vds=4 V and Vgs=0 V was 2.19×10$^{-12}$ A so that superior N-type thin-film semiconductor devices having an on-off ratio of more than seven orders of magnitude resulting from a mere a 4 V change at the gate electrode were created. Similarly, for PMOS transistors measured with Vds=−8 V, the saturation mobility was 77 cm$^2$·V$^{-1}$·sec$^{-1}$, the threshold voltage was −1.88 V, the subthreshold swing was 0.222 V, and the density of donor-like states determined from the threshold voltage and flat band voltage was 1.56×10$^{16}$ cm$^{-3}$.

Additionally, on-current defined at Vds=Vgs=4 V was 4.61×10$^{-6}$ A, and off-current at Vds=−4 V and Vgs=0 V was 2.10×10$^{-12}$ A so that superior P-type thin-film semiconductor devices having an on-off ratio of more than 6.3 orders of magnitude resulting from a mere a 4 V change at the gate electrode were created. The characteristics of such semiconductor devices were essentially constant over the substrate indicating that high performance semiconductor devices were uniformly produced. In contrast to these results, transistors fabricated using the prior art in which the deposited amorphous silicon layer was crystallized by an excimer laser produced the following results. For NMOS transistors, the saturation mobility was 33 cm$^2$·V$^{-1}$·sec$^{-1}$, the threshold voltage was 3.70 V, the subthreshold swing was 0.646 V, and the density of acceptor-like states was 2.65×10$^{16}$ cm$^{-3}$. For PMOS transistors, the saturation mobility was 16 cm$^2$·V$^{-1}$·sec$^{-1}$, the threshold voltage was −7.06 V, the subthreshold swing was 0.617 V, and the density of donor-like states was 6.55×10$^{16}$ cm$^{-3}$. As this example shows, the present invention makes it possible to conveniently, simply, and reliably create by means of a low temperature step of 600° C. or lower extremely high quality thin film semiconductor devices that exhibit steep subthreshold characteristic and that have both N-type and P-type semiconductor devices possessing high mobility and low threshold voltages. In particular, as can be seen from the values for the subthreshold swing, the greatest effect of the present invention is that it significantly reduces the density of trap states near the center of the band gap and significantly reduces both acceptor-like and donor-like trap states, thus allowing low voltage driving of circuits using thin film semiconductor devices. Furthermore, in the technology of the prior art, if the mobility were high, the threshold voltage and density of trap states were also increased; but by means of the present invention, it is possible to achieve the remarkable result of simultaneously achieving high mobility and low threshold voltage and low trap state densities.

Example 2

With the exception of the irradiation of the semiconductor layer by the second harmonic of the pulsed Nd:YAG laser in the laser irradiation step, thin film semiconductor devices are produced using exactly the same fabrication steps as described in Example 1. Example 2 differs from Example 1 in only the two areas of (1) the degree of translation of the 270 μm wide, 10 mm long, line profile YAG 2ω pulsed laser beam after each irradiation, and (2) the irradiation energy density of the laser beam on the semiconductor layer. Four standards corresponding to translation of the laser beam in the direction of the beam width of 10%, 5%, 2.5%, and 1.67% after each irradiation were selected. As a result, a given location on the semiconductor film would receive approximately 10, 20, 40, and 60 laser irradiations, respectively, corresponding to the four degrees of translation. The laser beam irradiation energy density on the semiconductor film was varied from 400 mJ·cm$^{-2}$ to 800 mJ·cm$^{-2}$. The peaks in the laser energy density gradient vary proportionally from 1.99 mJ·cm$^{-2}$·μm$^{-1}$ to 3.97 mJ·cm$^{-2}$·μm$^{-1}$. As in Example 1, the variation of the YAG 2ω laser irradiation energy density on the semiconductor film with respect to the average is approximately 4%, and $E_{SM}$ is on the order of 100 mJ·cm$^{-2}$ while $E_{CM}$ is on the order of 850 mJ·cm$^{-2}$.

The electrical characteristics of thin film semiconductor devices fabricated in this fashion are shown in FIGS. 13 to 20. The electrical characteristics were found from linear current at Vds=±0.1 V for transistors whose channels were 10 μm in both length and width. Therefore, the mobility shown in this Example 2 is the field effect mobility. Further, the values are the average values for four transistors created under each set of conditions. In these figures, the horizontal axis (x-axis) in all cases is the irradiation energy density of the YAG 2ω laser beam at the surface of the semiconductor layer while the vertical axis (y-axis) shows the corresponding electrical characteristics. Additionally, for the sake of comparison, the results of transistors using solid phase polycrystalline film that have not been subjected to YAG 2ω laser irradiation are shown at 0 mJ·cm$^{-2}$.

Figure 13:
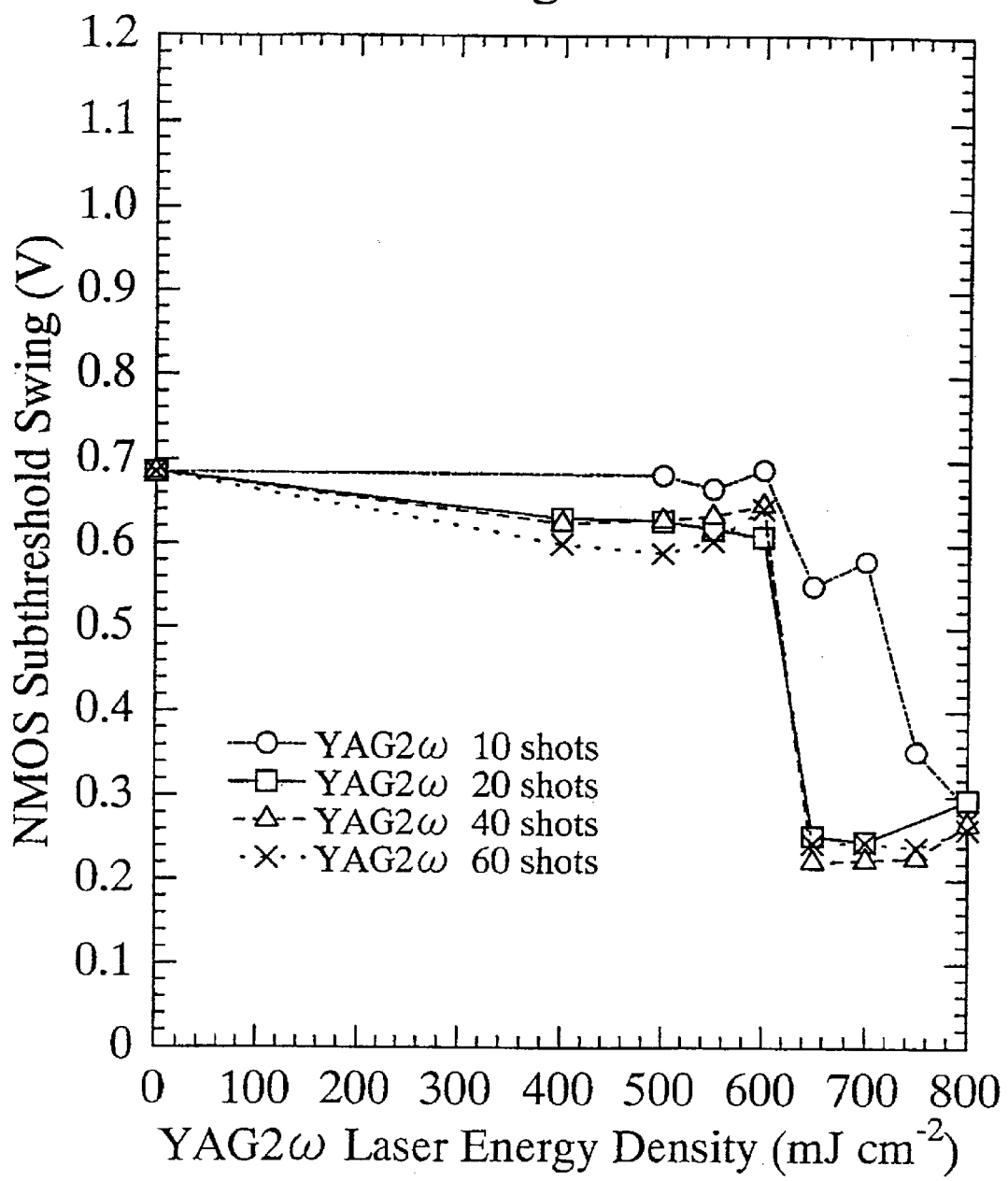
Figure 14:
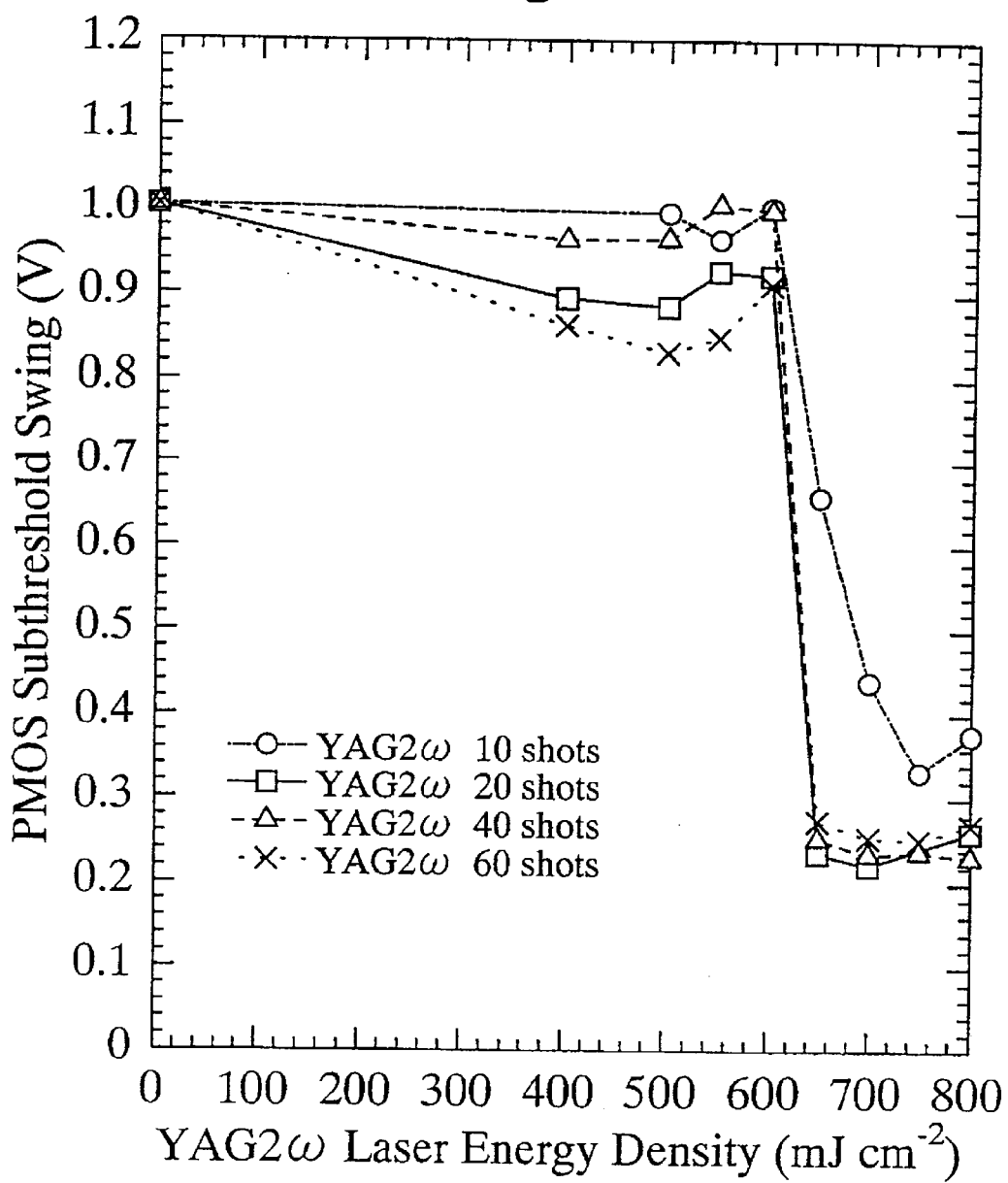

FIGS. 13 and 14 show subthreshold swing data for NMOS and PMOS, respectively. The figures show that when the irradiation energy density exceeds about 600 mJ·cm$^{-2}$—that is, if a volume fraction of 67% or greater along the depth of the semiconductor film is melted—, the subthreshold characteristics are markedly improved, and both NMOS and PMOS exhibit a superior subthreshold value of 0.3 V or less. The fact that they exhibit superior values despite a thick insulator film thickness of 119 nm indicates that there is an extremely low trap state density (deep trap state density) located near the center of the forbidden band in the energy band diagram of the obtained crystalline semiconductor film, proving that dangling bonds and other crystal defects are efficiently reduced by means of the laser irradiation step of the present invention. Moreover, the energy density range exhibiting good characteristics extends to 800 mJ·cm$^{-2}$ which is just prior to complete melting. Although an effect can be seen with as few at 10 shots from the laser, the subthreshold characteristics are particularly outstanding at irradiation counts ranging from 20 to 60.

Figure 15:
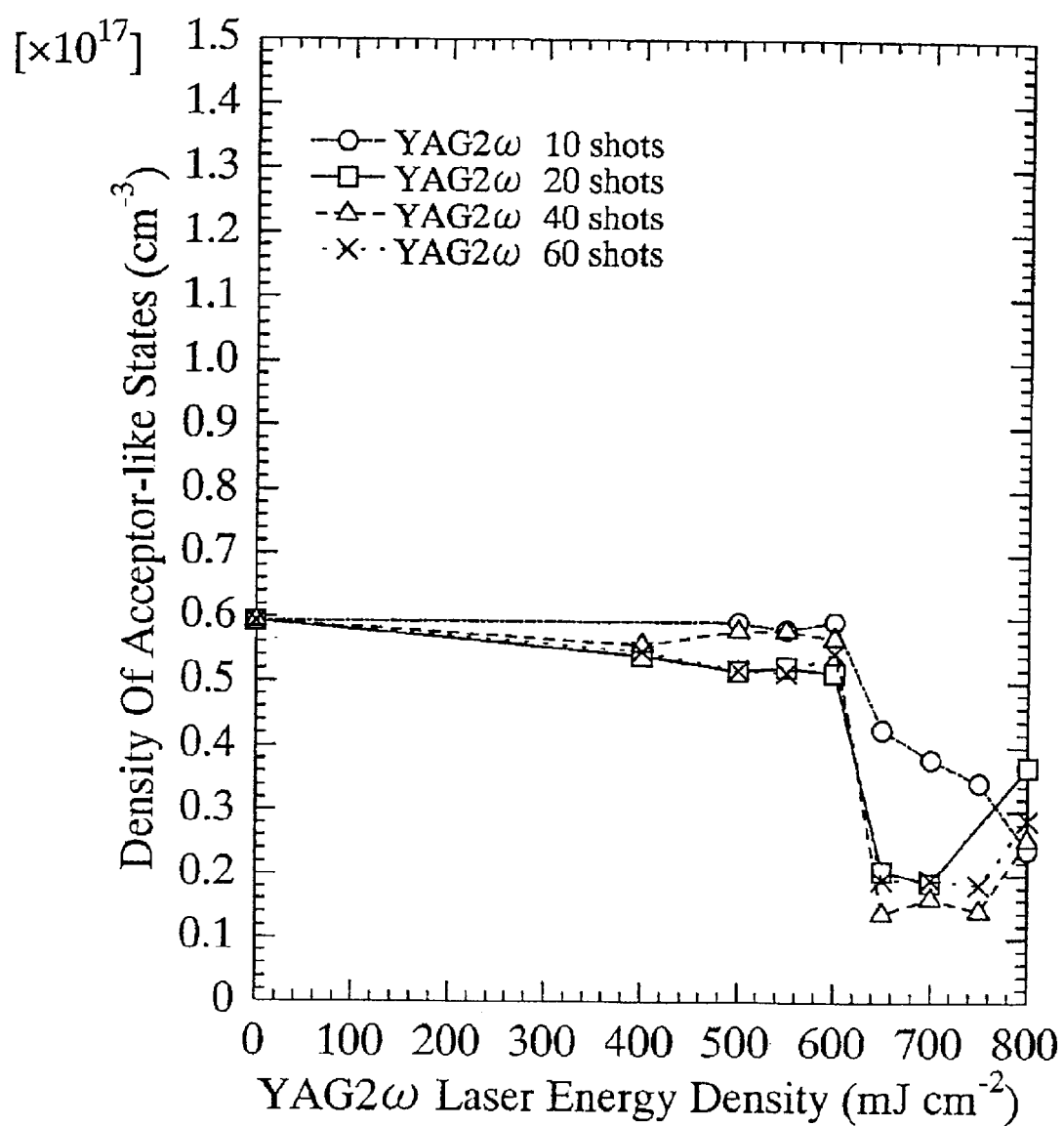
Figure 16:
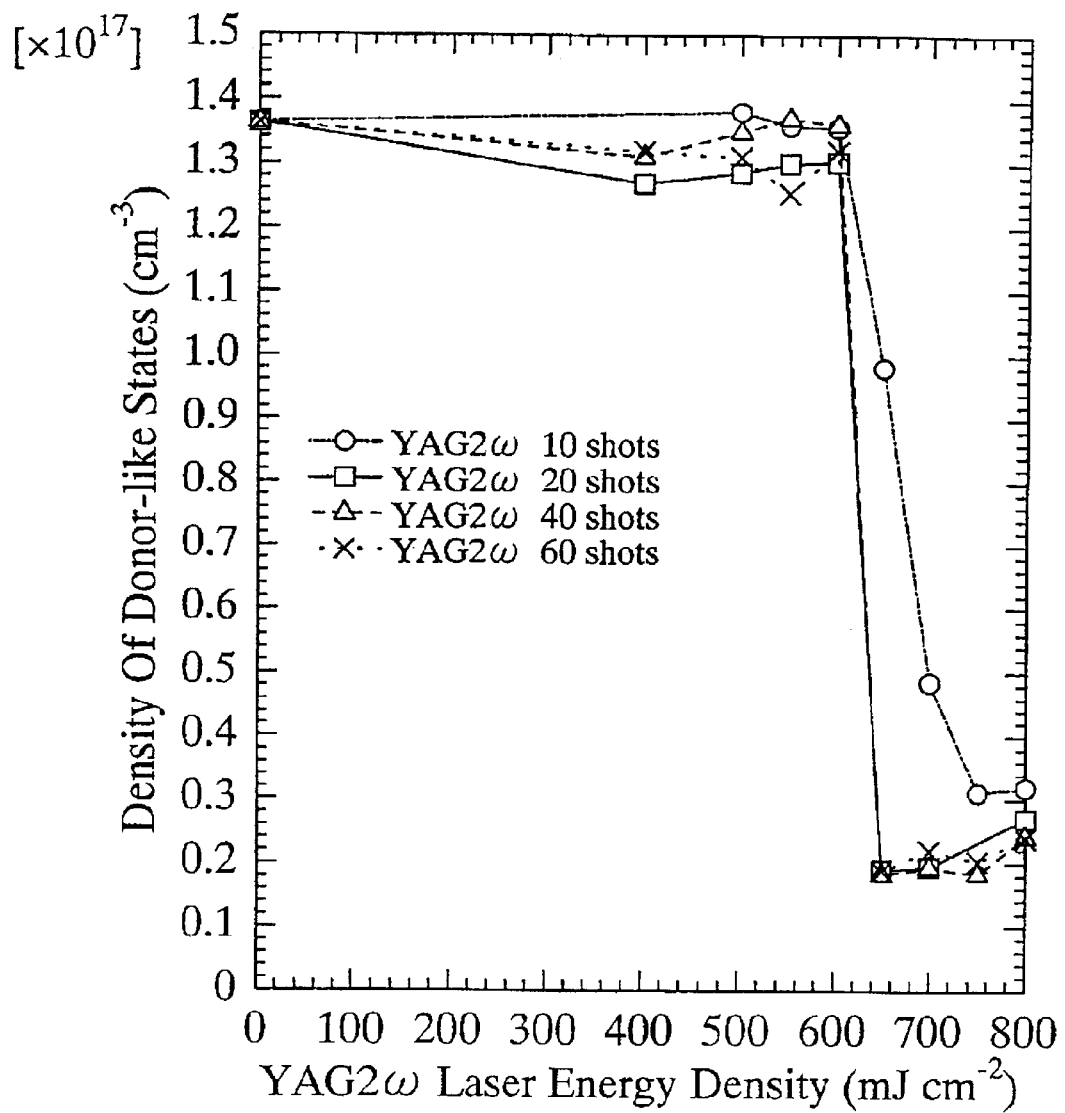
Figure 17:
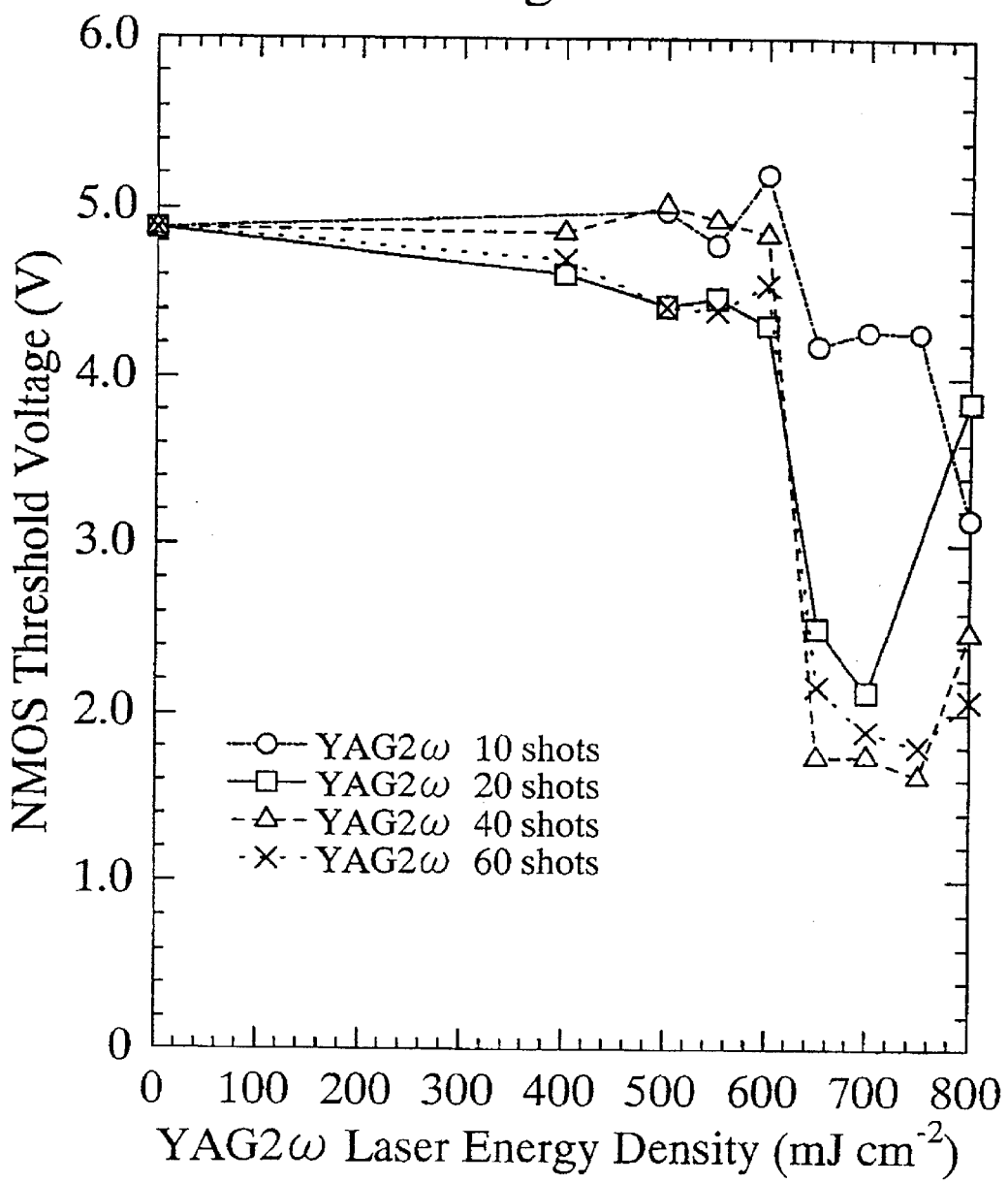
Figure 18:
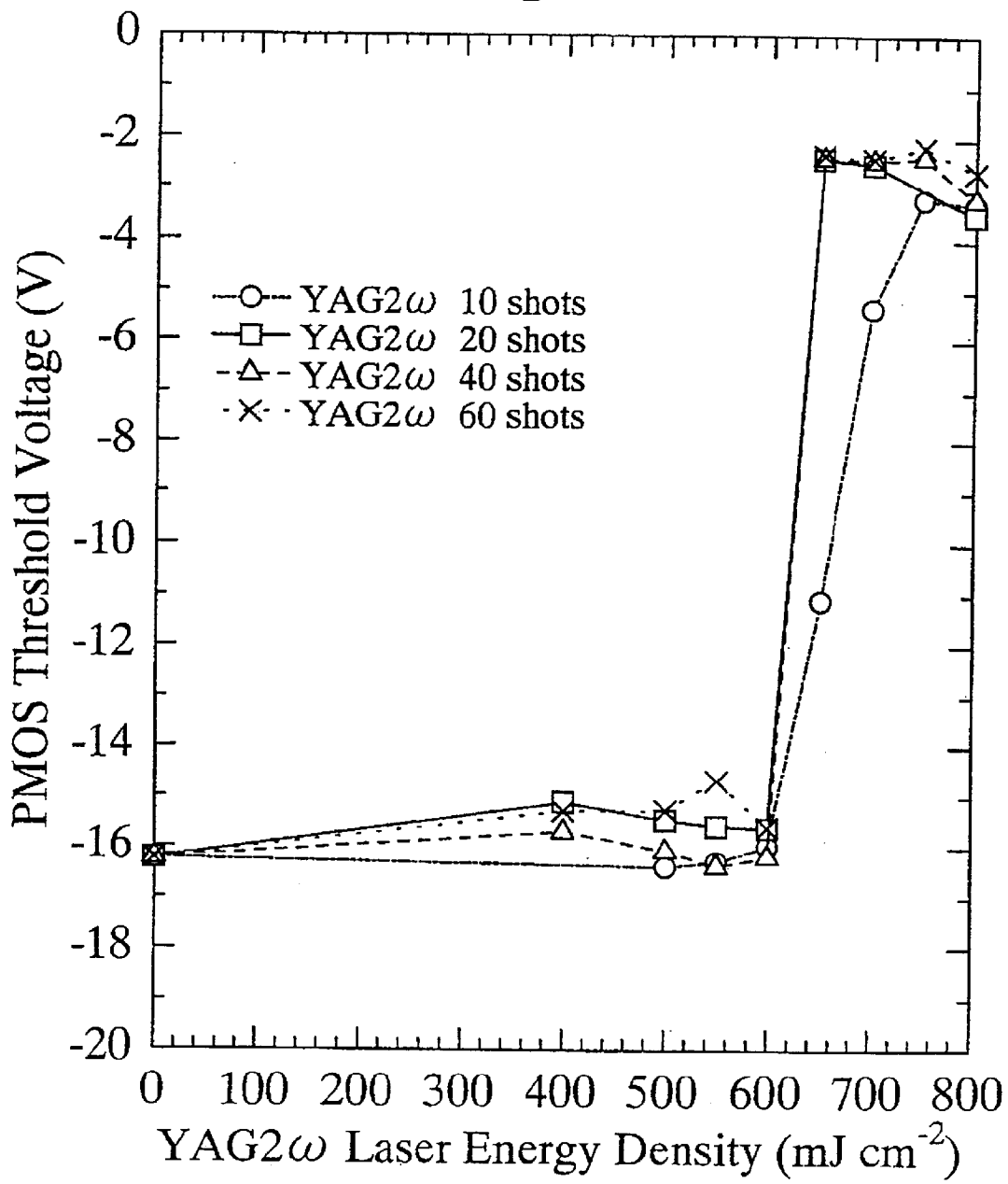

FIGS. 15 and 16 show the dependence of the acceptor-like and donor-like trap state densities, which are determined from threshold voltage and flat band voltage, on the YAG 2ω laser energy density. The same trends as seen in FIGS. 13 and 14 are shown here, with the density of both types of trap states decreasing markedly when a volume fraction of 67% or greater along the depth of the semiconductor film is melted. This means that there is an extremely low density of acceptor-like trap states (shallow acceptor-like trap state density) near the conduction band in the forbidden band and donor-like trap states near the valence band (shallow donor-like trap state density), proving that stacking faults, twins, and other crystal defects are efficiently reduced by means of the laser irradiation step of the present invention. Similarly, FIGS. 17 and 18 show threshold voltages found from the linear current of NMOS and PMOS; and it can be seen that when a volume fraction of approximately 67% or greater along the depth of the semiconductor film is melted, both types of transistor have threshold voltages of roughly 2 V allowing a multitude of practical applications. As with the subthreshold characteristics, an effect can be seen with as few as 10 shots from the laser, but 20 to 60 shots is desirable for reducing the density of shallow trap states and for lowering the threshold voltage.

Figure 19:
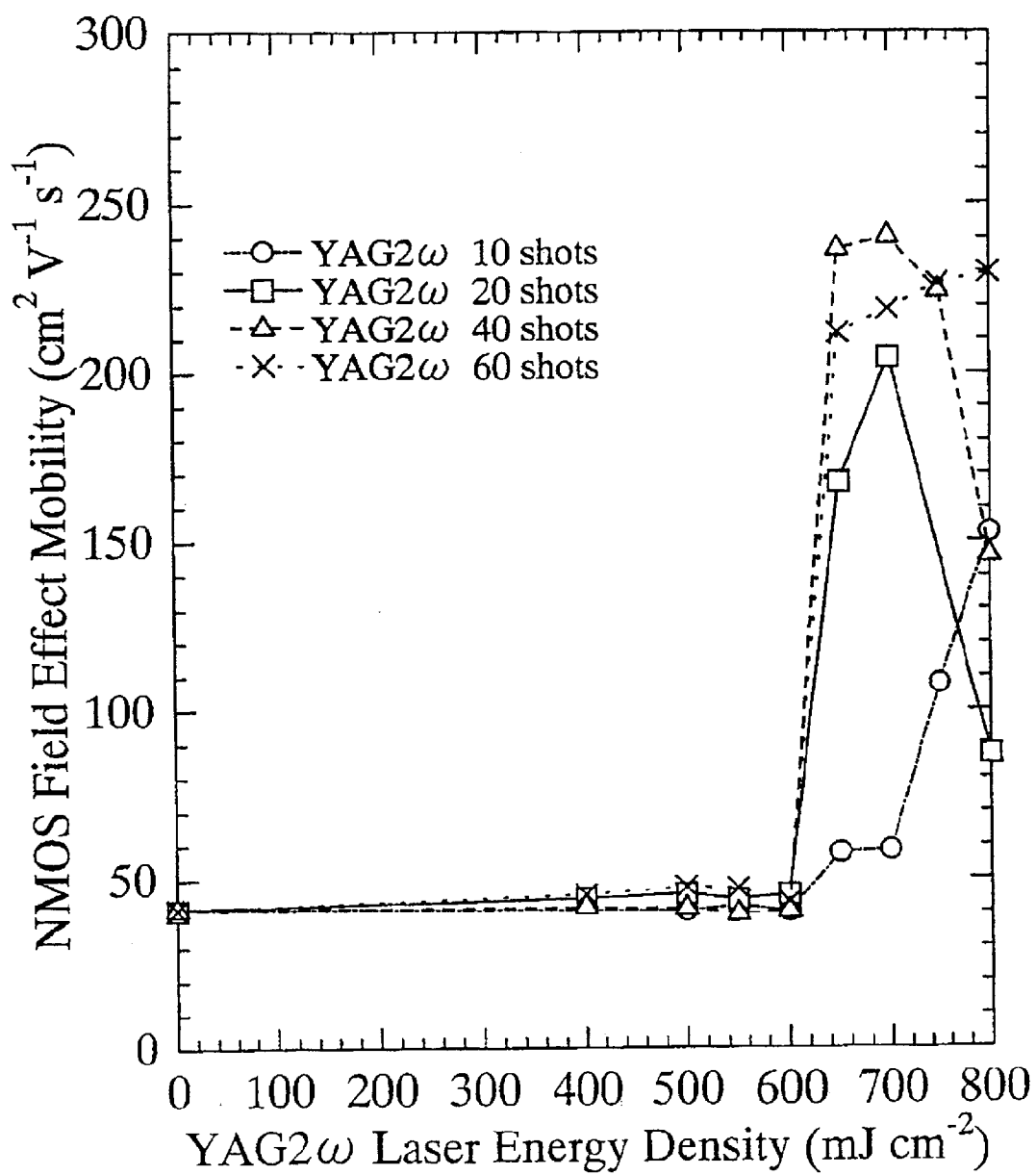
Figure 20:
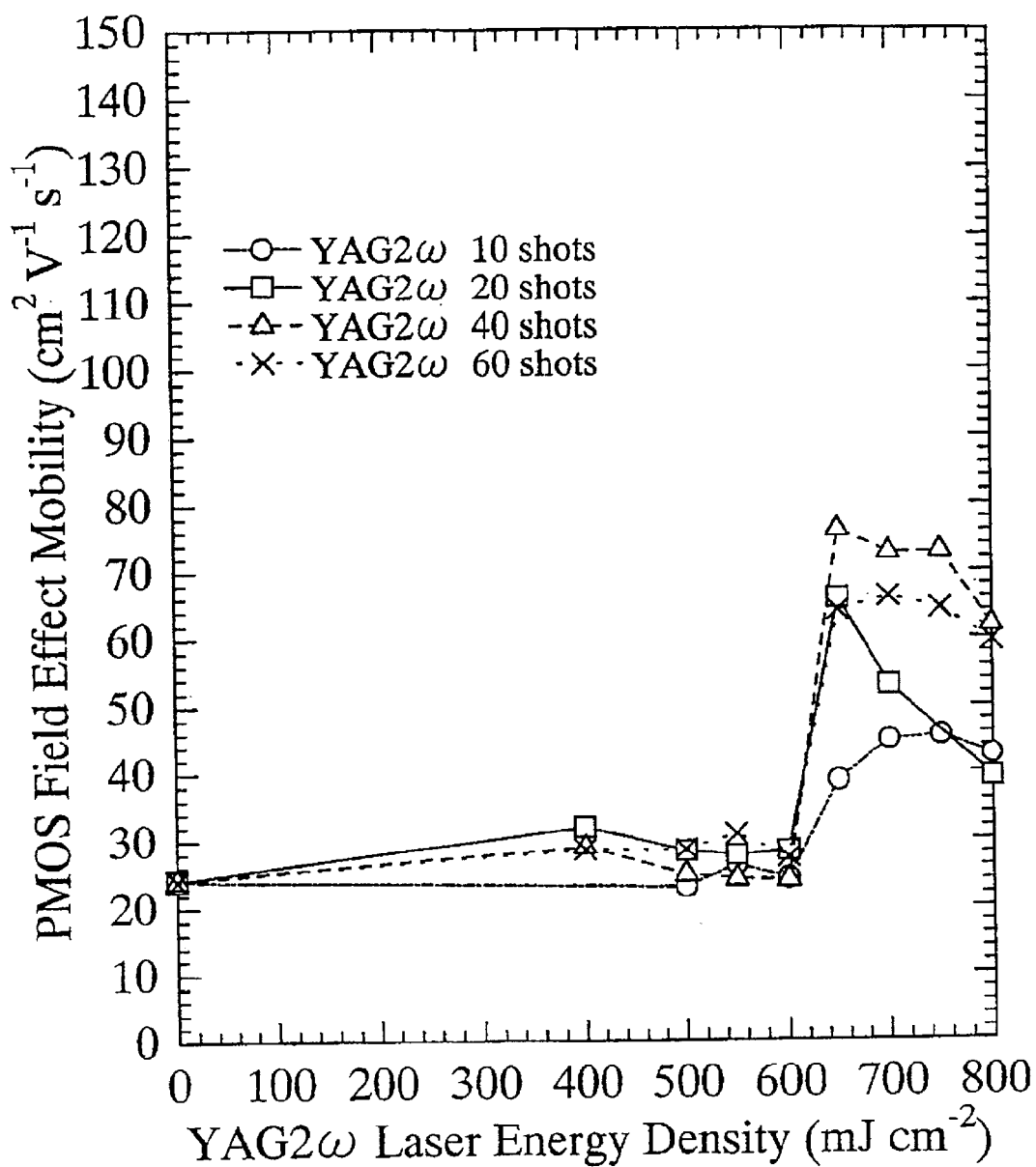

FIGS. 19 and 20 are graphs related to field effect mobility found from the linear current of NMOS and PMOS. If the irradiated energy density exceeds about 600 mJ·cm$^{-2}$—that is, if a volume fraction of 67% or greater along the depth of the semiconductor film is melted—, exceptionally large mobilities can be obtained for both NMOS and PMOS. If there are few intergranular defects, mobility has a strong positive correlation with grain size, both theoretically and experimentally. Therefore, FIGS. 19 and 20 mean that if thin-film semiconductor devices are created in accordance with the present invention, the crystalline semiconductor films will be composed of large grains having a low occurrence of defects. With a laser shot count of between about 40 and 60 shots, high mobility can be obtained over a wide range of energy densities.

As shown in this Example 2, it is possible to easily produce thin film semiconductor devices that are far superior to those previously produced by melting a volume fraction equal to or greater than about 67% along the depth of the semiconductor film, and if the laser shot count is between about 20 and 60 shots, the density of trapped states is markedly reduced, and when the laser shot count is more than about 40 shots but less than about 60, excellent results in terms of both low threshold voltage and high mobility can be obtained.

As described above, the fabrication procedure for thin film semiconductor devices of the present invention makes it possible to simply and reliably produce high performance thin film semiconductor devices using a low temperature step in which low cost glass substrates can be used. Consequently, applying the present invention to the production of active matrix liquid crystal display devices enables the simple and reliable production of high quality liquid crystal display devices on large substrates. Additionally, when applied to the fabrication of other electronic circuits, the present invention makes it possible to produce high quality electronic circuits both simply and reliably.

What is claimed is:

1. A method of fabricating on a substrate a thin film semiconductor device that employs as the active layer a crystalline semiconductor film composed primarily of silicon (Si), the method comprising:

a semiconductor film formation step in which an amorphous semiconductor film composed primarily of silicon (Si) is deposited on a substrate;

a solid phase crystallization step in which said amorphous semiconductor film is crystallized in the solid phase to yield a solid phase crystallization film containing a crystalline component and non-crystalline component; and a laser irradiation step in which a pulsed laser beam irradiates said solid phase crystallization film to yield a crystalline semiconductor film;

wherein the wavelength of said pulse laser beam is 370 nm or more and 710 nm or less, and an absorption coefficient of the laser beam of this wavelength range in the non-crystalline component is larger than an absorption coefficient in the crystalline component.

2. A method of fabricating the thin-film semiconductor device according to claim 1, wherein the wavelength of said pulsed laser beam is approximately 450 nm or more and approximately 650 nm or less.

3. A method of fabricating the thin-film semiconductor device according to claim 2, wherein the wavelength of said pulsed laser beam is approximately 532 nm.

4. A method of fabricating the thin-film semiconductor device according to claim 1, wherein said pulsed laser beam is a high harmonic of a Q-switched solid state laser.

5. A method of fabricating the thin-film semiconductor device according to claim 1, wherein said pulsed laser beam is a high harmonic frequency of a Q-switched solid state laser having as the lasing medium an Nd ion doped crystal.

6. A method of fabricating the thin-film semiconductor device according to claim 1, wherein said pulsed laser beam is the second harmonic frequency of a Q-switched Nd:YAG laser beam.

7. A method of fabricating the thin-film semiconductor device according to claim 1, wherein said pulsed laser beam is the second harmonic frequency of a Q-switched Nd:YVO$_4$ laser beam.

8. A method of fabricating the thin-film semiconductor device according to claim 1, wherein the irradiation energy density on said solid phase crystallization film of said pulsed laser beam is at least of an intensity that melts at least the surface of said solid phase crystallization film.

9. A method of fabricating the thin-film semiconductor device according to claim 1, wherein the irradiation energy density on said solid phase crystallization film of said pulsed laser beam is of an intensity that melts two-thirds or more of said solid phase crystallization film along the depth direction.

10. A method of fabricating the thin-film semiconductor device according to claim 1, wherein the irradiation energy density on said solid phase crystallization film of said pulsed laser beam is of an intensity that is less than that which will cause ablation of a portion of said solid phase crystallization film.

11. A method of fabricating the thin-film semiconductor device according to claim 1, wherein the irradiation energy density on said solid phase crystallization film of said pulsed laser beam is of an intensity that is less than necessary for complete melting of said solid phase crystallization film in the depth direction.

12. A method of fabricating on a substrate a thin film semiconductor device that employs as the active layer a crystalline semiconductor film composed primarily of silicon (Si), the method comprising:

a semiconductor film formation step in which an amorphous semiconductor film composed primarily of silicon (Si) is deposited on a substrate;

a solid phase crystallization step in which said amorphous semiconductor film is crystallized in the solid phase to yield a solid phase crystallization film containing a crystalline component and a non-crystalline component; and a laser irradiation step in which a pulsed laser beam having a wavelength of approximately 532 nm irradiates said solid phase crystallization film to yield a crystalline semiconductor film;

wherein the irradiated energy intensity of said pulse laser beam on said solid phase crystallization film is approximately 100 mJ·cm$^{-2}$ or more and approximately 1500 mJ·cm$^{-2}$ or less; and wherein an absorption coefficient of the laser beam of this wavelength in the non-crystalline component is larger than an absorption coefficient in the crystalline component.

13. A method of fabricating on a substrate a thin film semiconductor device that employs as the active layer a crystalline semiconductor film composed primarily of silicon (Si), the method comprising:

a semiconductor film formation step in which an amorphous semiconductor film composed primarily of silicon (Si) is deposited on a substrate;

a solid phase crystallization step in which said amorphous semiconductor film is crystallized in the solid phase yield a solid phase crystallization film containing a crystalline component and a non-crystalline component; and a laser irradiation step in which a pulsed laser beam having a wave length of approximately 532 nm irradiates said solid phase crystallization film to yield a crystalline semiconductor film;

wherein the irradiated energy intensity of said pulse laser beam on said solid phase crystallization film is approximately 600 mJ·cm$^{-2}$ or more and approximately 1500 mJ·cm$^{-2}$ or less; and wherein an absorption coefficient of the laser beam of this wavelength in the non-crystalline component is larger than an absorption coefficient in the crystalline component.

14. A method of fabricating on a substrate a thin film semiconductor device that employs as the active layer a crystalline semiconductor film composed primarily of silicon (Si), the method comprising:

a semiconductor film formation step in which an amorphous semiconductor film composed primarily of silicon (Si) is deposited on a substrate;

a solid phase crystallization step in which said amorphous semiconductor film is crystallized in the solid phase to yield a solid phase crystallization film containing a crystalline component and a non-crystalline component; and a laser irradiation step in which a pulsed laser beam having a wavelength of approximately 532 nm irradiates said solid phase crystallization film to yield a crystalline semiconductor film;

wherein the irradiated energy intensity of said pulse laser beam on said solid phase crystallization film is approximately 100 mJ·cm$^{-2}$ or more and approximately 850 mJ·cm$^{-2}$ or less; and wherein an absorption coefficient of the laser beam of this wavelength in the non-crystalline component is larger than an absorption coefficient in the crystalline component.

15. A method of fabricating on a substrate a thin film semiconductor device that employs as the active layer a crystalline semiconductor film composed primarily of silicon (Si), the method comprising:

a semiconductor film formation step in which an amorphous semiconductor film composed primarily of silicon (Si) is deposited on a substrate;

a solid phase crystallization step in which said amorphous semiconductor film is crystallized in the solid phase to yield a solid phase crystallization film containing a crystalline component and a non-crystalline component; and a laser irradiation step in which a pulsed laser beam having a wavelength of approximately 532 nm irradiates said solid phase crystallization film to yield a crystalline semiconductor film;

wherein the irradiated energy intensity of said pulse laser beam on said solid phase crystallization film is approximately 600 mJ·cm$^{-2}$ or more and approximately 850 mJ·cm$^{-2}$ or less; and wherein an absorption coefficient of the laser beam of this wave length in the non-crystalline component is larger than an absorption coefficient in the crystalline component.

16. A method of fabricating the thin-film semiconductor device according to claim 1, wherein said substrate is placed in a thermal annealing furnace and said solid phase crystallization step is conducted is a state of near thermal equilibrium.

17. A method of fabricating the thin-film semiconductor device according to claim 16, wherein said thermal annealing is performed at an annealing temperature of approximately 400° C. or greater and 700° C. or less.

18. A method of fabricating the thin-film semiconductor device according to claim 1, wherein said solid phase crystallization step is performed by means of a rapid thermal annealing system.

19. A method of fabricating on a substrate a thin film semiconductor device that employs as the active layer a crystalline semiconductor film composed primarily of silicon (Si), the method comprising:

a semiconductor film formation step in which an amorphous semiconductor film composed primarily of silicon (Si) is deposited on a substrate;

a solid phase crystallization step in which said amorphous semiconductor film is crystallized in the solid phase to yield phase crystallization film containing a crystalline component and a non-crystalline component; and a laser irradiation step in which a pulsed laser beam irradiates said solid phase crystallization film to yield a crystalline semiconductor film;

wherein said pulsed laser beam has an absorption coefficient in amorphous silicon that is greater than the absorption coefficient in polysilicon; and wherein an absorption coefficient of the laser beam in the non-crystalline component is larger than an absorption coefficient in the crystalline component.

20. A method of fabricating the thin-film semiconductor device according to claim 19, wherein the irradiation region of said pulsed laser beam on said solid phase semiconductor film is an essentially rectangular profile having width W ($\mu$m) and length L (mm).

21. A method of fabricating the thin-film semiconductor device according to claim 20, wherein the irradiation energy density of said pulsed laser beam in said lengthwise direction in said irradiation region has an essentially trapezoidal distribution.

22. A method of fabricating the thin-film semiconductor device according to claim 20, wherein the irradiation energy density of said pulsed laser beam in said widthwise direction in said irradiation region has an essentially trapezoidal distribution.

23. A method of fabricating the thin-film semiconductor device according to claim 20, wherein the ratio (L/W) of said length L to said width W is 100 or higher.

24. A method of fabricating the thin-film semiconductor device according to claim 20, wherein the ratio (L/W) of said length L to said width W is 1000 or higher.

25. A method of fabricating the thin-film semiconductor device according to claim 20, wherein the maximum irradiation energy density gradient value of said pulsed laser beam in the width wise direction is 3 mJ·cm$^{-2}$·m$^{-1}$ or higher.

26. A method of fabricating the thin-film semiconductor device according to claim 20, wherein the position at which the maximum irradiation energy density gradient value of said pulsed laser beam in the width wise direction is reached and the position at which the maximum irradiation energy density of said pulse laser beam in said width wise direction is reached are nearly coincident.

27. A method of fabricating the thin-film semiconductor device according to claim 20, wherein said width W is between approximately 1 $\mu$m and 6 $\mu$m.

28. A method of fabricating the thin-film semiconductor device according to claim 20, wherein said irradiation region is shifted in the width wise direction with each laser shot.

29. A method of fabricating the thin-film semiconductor device according to claim 20, wherein said width wise direction is essentially parallel to the direction of current within the active layer of a thin-film semiconductor device.

30. A method of fabricating the thin-film semiconductor device according to claim 19, wherein a given location on said semiconductor layer is covered by between approximately 10 and 80 shots from a pulsed laser beam.

31. A method of fabricating on a substrate a thin film semiconductor device that employs as the active layer a crystalline semiconductor film composed primarily of silicon (Si), the method comprising:

a semiconductor film formation step in which an amorphous semiconductor film composed primarily of silicon (Si) is deposited on a substrate to film thickness d (nm);

a solid phase crystallization step in which said amorphous semiconductor film is crystallized in the solid phase to yield a solid phase crystallization film containing a crystalline component and a non-crystalline component; and a laser irradiation step in which a pulsed laser beam having an absorption coefficient of $\mu_{pSi}$ that is 10$^{-3}$ nm$^{-1}$ or more and 10$^{-2}$ nm$^{-1}$ or less in polysilicon irradiates said solid phase crystallization film;

wherein said film thickness d and said absorption coefficient $\mu_{pSi}$ satisfy the relationship:

$$0.105 \cdot \mu_{pSi}^{-1} < d < 0.693 \cdot \mu_{pSi}^{-1}; \text{ and}$$

wherein the absorption coefficient of the laser beam in the non-crystalline component is larger than an absorption coefficient in the crystalline component.

32. A method of fabricating on a substrate a thin film semiconductor device that employs as the active layer a crystalline semiconductor film composed primarily of silicon (Si), the method comprising:

a semiconductor film formation step in which an amorphous semiconductor film composed primarily of silicon (Si) is deposited on a substrate to film thickness d (nm);

a solid phase crystallization step in which said amorphous semiconductor film is crystallized in the solid phase to yield a solid phase crystallization film containing a crystalline component and a non-crystalline component; and a laser irradiation step in which a pulsed laser beam having an absorption coefficient of $\mu_{pSi}$ that is $10^{-3}$ nm$^{-1}$ or more and $10^{-2}$ nm$^{-1}$ or less in polysilicon irradiates said solid phase crystallization film;

wherein said film thickness d and said absorption coefficient $\mu_{pSi}$ satisfy the relationship:

$0.405 \cdot \mu_{pSi}^{-1} < d < 0.693 \cdot \mu_{pSi}^{-1}$; and wherein the absorption coefficient of the laser beam in the non-crystalline component is larger than an absorption coefficient in the crystalline component.

33. A method of fabricating the thin-film semiconductor device according to claim 31, wherein said substrate is transparent.

34. A method of fabricating on a substrate a thin film semiconductor device that employs as the active layer a crystalline semiconductor film composed primarily of silicon (Si), the method comprising:

a semiconductor film formation step in which an amorphous semiconductor film composed primarily of silicon (Si) is deposited on a substrate to film thickness of between approximately 25 nm and 165 nm;

a solid phase crystallization step in which said amorphous semiconductor film is crystallized in the solid phase to yield a solid phase crystallization film containing a crystalline component and a non-crystalline component; and a laser irradiation step in which the second harmonic frequency of a Nd:YAG laser beam irradiates said solid phase crystallization film;

wherein an absorption coefficient of the laser beam in the non-crystalline component is larger than an absorption coefficient in the crystalline component.

35. A method of fabricating the thin-film semiconductor device according to claim 34, wherein the thickness of said semiconductor film is between approximately 25 nm and 95 nm.

* * * * *